United States Patent
Osumi et al.

(10) Patent No.: US 10,295,618 B2
(45) Date of Patent: May 21, 2019

(54) MAGNETIC PERMEABILITY SENSOR AND MAGNETIC PERMEABILITY DETECTING METHOD, DIELECTRIC PERMITTIVITY SENSOR AND DIELECTRIC PERMITTIVITY DETECTING METHOD, AND MAGNETIC PERMEABILITY AND DIELECTRIC PERMITTIVITY SENSOR AND MAGNETIC PERMEABILITY AND DIELECTRIC PERMITTIVITY DETECTING METHOD

(71) Applicant: Hitachi Metals, Ltd., Tokyo (JP)

(72) Inventors: Kazuhiko Osumi, Takasaki (JP); Yuuzo Maruyama, Takasaki (JP); Osamu Shimoe, Takasaki (JP)

(73) Assignee: Hitachi Metals, Ltd., Tokyo (JP)

( * ) Notice: Subject to any disclaimer, the term of this patent is extended or adjusted under 35 U.S.C. 154(b) by 299 days.

(21) Appl. No.: 14/744,876

(22) Filed: Jun. 19, 2015

(65) Prior Publication Data

US 2016/0084924 A1 Mar. 24, 2016

(30) Foreign Application Priority Data

Sep. 19, 2014 (JP) .................................. 2014-191360
Mar. 19, 2015 (JP) .................................. 2015-056619
Apr. 16, 2015 (JP) .................................. 2015-84419

(51) Int. Cl.
*G01R 33/12* (2006.01)
*G03G 15/08* (2006.01)

(52) U.S. Cl.
CPC ....... *G01R 33/1223* (2013.01); *G03G 15/086* (2013.01); *G03G 15/0853* (2013.01)

(58) Field of Classification Search
CPC ... G03G 15/08; G03G 15/086; G01R 33/1223
See application file for complete search history.

(56) References Cited

U.S. PATENT DOCUMENTS

| 3,546,578 A | 12/1970 | Sisson et al. |
| 4,733,556 A | 3/1988 | Meitzler et al. |

(Continued)

FOREIGN PATENT DOCUMENTS

| CN | 1169776 A | 1/1998 |
| JP | S 56-161653 U | 12/1981 |

(Continued)

OTHER PUBLICATIONS

Japanese Office Action for Japanese Application No. 2014-191360 dated Feb. 28, 2018 with English translation.

(Continued)

*Primary Examiner* — Jermele M Hollington
*Assistant Examiner* — Alvaro Fortich
(74) *Attorney, Agent, or Firm* — Muncy, Geissler, Olds & Lowe, P.C.

(57) ABSTRACT

Each of the oscillation frequency of a first oscillation circuit performing oscillation in a state of including a coil and a capacitor and the oscillation frequency of a second oscillation circuit performing oscillation in a state of including a coil and a capacitor different from the coil and the capacitor of the first oscillation circuit is measured. Then, the difference of the measured oscillation frequencies is calculated and then the calculated difference is converted into a magnetic permeability or a dielectric permittivity. One sensor selectively detects a change in the magnetic permeability or a change in the dielectric permittivity of a subject material.

10 Claims, 28 Drawing Sheets

(56) References Cited

U.S. PATENT DOCUMENTS

| | | | | |
|---|---|---|---|---|
| 5,353,103 A * | 10/1994 | Okamoto | ........... | G03G 15/0126 |
| | | | | 118/689 |
| 5,689,756 A * | 11/1997 | Taki | ................... | G03G 15/1655 |
| | | | | 399/33 |
| 6,057,684 A | 5/2000 | Murakami et al. | | |
| 2002/0154918 A1 * | 10/2002 | Sawayama | ............. | G01N 27/72 |
| | | | | 399/63 |
| 2003/0164766 A1 | 9/2003 | Britton | | |
| 2004/0160382 A1 * | 8/2004 | Rawnick | ................. | H01Q 3/44 |
| | | | | 343/909 |
| 2004/0178865 A1 * | 9/2004 | Snyder | ...................... | H01P 9/00 |
| | | | | 333/156 |
| 2005/0090988 A1 * | 4/2005 | Bryant | ...................... | G01V 1/34 |
| | | | | 702/14 |
| 2006/0001941 A1 * | 1/2006 | Mizoguchi | ......... | G02B 26/0841 |
| | | | | 359/224.1 |
| 2006/0127111 A1 * | 6/2006 | Komori | .............. | G03G 15/0853 |
| | | | | 399/30 |
| 2007/0069720 A1 | 3/2007 | Goldfine et al. | | |
| 2007/0223946 A1 * | 9/2007 | Watanabe | ............ | G03G 15/556 |
| | | | | 399/27 |
| 2008/0187021 A1 * | 8/2008 | Haarer | ...................... | G01K 3/04 |
| | | | | 374/102 |
| 2009/0021251 A1 | 1/2009 | Simon | | |
| 2010/0101336 A1 * | 4/2010 | Yamakawa | ............. | G01L 3/105 |
| | | | | 73/862.333 |
| 2010/0157304 A1 | 6/2010 | Takahashi et al. | | |
| 2010/0253433 A1 * | 10/2010 | Velasquez | ........... | H03F 3/45183 |
| | | | | 330/257 |
| 2010/0290795 A1 | 11/2010 | Seki et al. | | |
| 2011/0182626 A1 * | 7/2011 | Hirota | ................ | G03G 15/0808 |
| | | | | 399/266 |
| 2011/0286769 A1 * | 11/2011 | Mihara | .............. | G03G 15/0877 |
| | | | | 399/254 |
| 2012/0201575 A1 * | 8/2012 | Kashimoto | ........ | G03G 15/0812 |
| | | | | 399/272 |
| 2012/0301160 A1 * | 11/2012 | Shu | .................... | G03G 15/0824 |
| | | | | 399/30 |
| 2013/0011147 A1 * | 1/2013 | Kimura | ................ | G03G 15/553 |
| | | | | 399/26 |
| 2014/0079413 A1 * | 3/2014 | Morales-Tirado | ... | G03G 9/0819 |
| | | | | 399/27 |
| 2014/0312886 A1 * | 10/2014 | Hirota | .................... | G01N 27/72 |
| | | | | 324/228 |
| 2016/0091448 A1 | 3/2016 | Soleimani | | |

FOREIGN PATENT DOCUMENTS

| | | |
|---|---|---|
| JP | S63168549 A | 7/1988 |
| JP | H 11-142219 A | 5/1999 |
| JP | 2000-131120 A | 5/2000 |
| JP | 2001121681 A | 5/2001 |
| JP | 2001-165910 A | 6/2001 |
| JP | 2002-296240 A | 10/2002 |
| JP | 2006-171176 A | 6/2006 |
| JP | 2006171175 A | 6/2006 |
| JP | 2007192769 A | 8/2007 |
| JP | 2008211762 A | 9/2008 |
| JP | 2009-031257 A | 2/2009 |
| JP | 2009-281748 A | 12/2009 |
| JP | 2010-266761 A | 11/2010 |
| WO | WO2014184536 A1 | 11/2014 |

OTHER PUBLICATIONS

Japanese Office Action dated Jan. 29, 2019 in corresponding Japanese application 2015-084419.

Japanese Office Action for Japanese Application No. 2018-083152 dated Mar. 8, 2019 with English translation.

* cited by examiner

INSIDE OF
DEVELOPMENT UNIT

OUTSIDE OF
DEVELOPMENT UNIT

F I G. 12
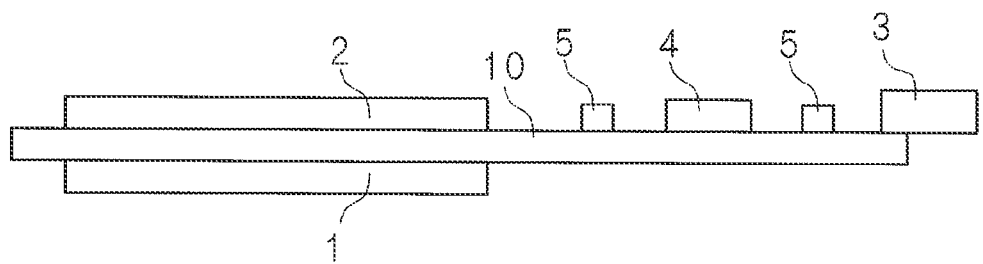

F I G. 14
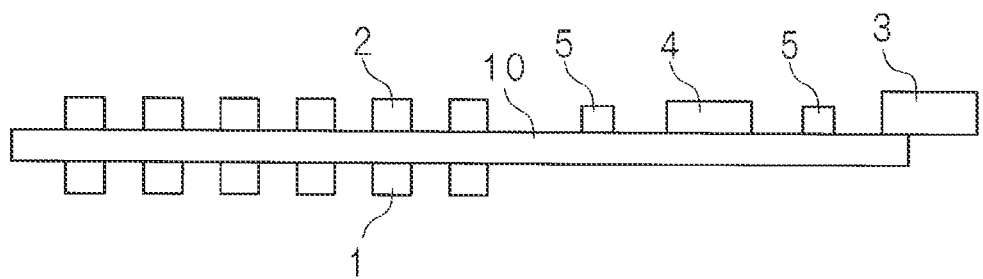

F I G. 24
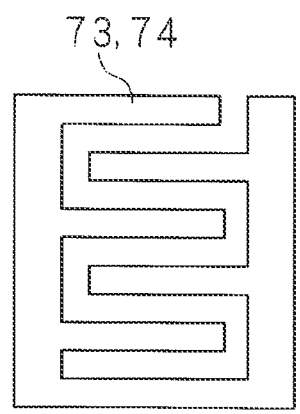

MAGNETIC PERMEABILITY SENSOR AND MAGNETIC PERMEABILITY DETECTING METHOD, DIELECTRIC PERMITTIVITY SENSOR AND DIELECTRIC PERMITTIVITY DETECTING METHOD, AND MAGNETIC PERMEABILITY AND DIELECTRIC PERMITTIVITY SENSOR AND MAGNETIC PERMEABILITY AND DIELECTRIC PERMITTIVITY DETECTING METHOD

CROSS-REFERENCE TO RELATED APPLICATIONS

This non-provisional application claims priority under 35 U.S.C. § 119(a) on Patent Applications No. 2014-191360 filed in Japan on Sep. 19, 2014, No. 2015-56619 filed in Japan on Mar. 19, 2015, and No. 2015-84419 filed in Japan on Apr. 16, 2015, the entire contents of which are hereby incorporated by reference.

FIELD

The present invention relates to: a magnetic permeability sensor detecting the magnetic permeability of a subject material and a magnetic permeability detecting method employing the magnetic permeability sensor; a dielectric permittivity sensor detecting the dielectric permittivity of a subject material and a dielectric permittivity detecting method employing the dielectric permittivity sensor; and a magnetic permeability and dielectric permittivity sensor selectively detecting the magnetic permeability or the dielectric permittivity of a subject material and a magnetic permeability and dielectric permittivity detecting method employing the magnetic permeability and dielectric permittivity sensor.

BACKGROUND

A copying machine or a printer of electrophotography system includes a toner sensor magnetically detecting the concentration or the amount of remaining toner in a development unit used for developing an electrostatic image formed in a photosensitive material. An example of such a toner sensor is disclosed in Japanese Patent Application Laid-Open No. 2001-165910. In the sensor disclosed in Japanese Patent Application Laid-Open No. 2001-165910, four coils are employed and then the toner concentration is detected by a differential transformer method.

Further, Japanese Patent Application Laid-Open No. 2009-31257 discloses a technique that a first oscillation circuit causing a phase shift in an oscillation wave in correspondence to an inductance change in a first sensing coil and a second oscillation circuit causing a phase shift in an oscillation wave in correspondence to an inductance change in a second sensing coil are employed and then the difference of the two phase shifts is obtained so that the state of a metal is detected.

On the other hand, as disclosed in Japanese Patent Application Laid-Open No. H11-142219, a toner sensor is known that detects the amount of remaining toner in a development unit by employing a piezoelectric element. In such a toner sensor, a piezoelectric element is caused to mechanically oscillate by application of an alternating voltage. Then, when a large amount of toner (the powder) is in contact with the piezoelectric element, the oscillation is stopped. When the toner (the powder) decreases so that the contact area becomes small, the piezoelectric element mechanically oscillates. Then, an electromotive voltage caused by the oscillation of the piezoelectric element is used for detecting the amount of the toner (the powder).

SUMMARY

The toner sensor of Japanese Patent Application Laid-Open No. 2001-165910 employs a differential transformer method. Then, in a case that a drive coil and a differential coil are located in the vicinity of each other, an influence of toner reaches both and hence the influence of toner to the drive coil and the differential coil is difficult to be completely avoided. Further, in a case that an oscillation circuit is constructed such as to include a flat coil, a change in the magnitude of linkage of the inductance generated when a magnetic material approaches is small. Thus, such a flat coil is difficult to be operated by an analog circuit.

In the technique disclosed in Japanese Patent Application Laid-Open No. 2009-31257, the oscillation waves from the first oscillation circuit and the second oscillation circuit are measured and then the times that the measured values reach a predetermined value are measured. Then, on the basis of the measured times, a phase shift in the accumulated oscillation waves is detected. Thus, there is a problem that the process of detection is complicated. In the technique disclosed in Japanese Patent Application Laid-Open No. 2009-31257, coils each wound around a high magnetic permeability material are employed and hence the oscillation frequencies are low. Thus, the time used for obtaining the same resolution is short and hence the method of phase shift detection is advantageous. However, the method is disadvantageous in a case that a flat coil is employed. Further, Japanese Patent Application Laid-Open No. 2009-31257 discloses a technique of magnetically detecting the torque of a revolving shaft and does neither disclose nor suggest application to a sensor detecting the concentration of the toner.

In a sensor detecting the magnetic permeability by employing two coils, for the purpose of suppressing a situation that the magnetic flux generated by one coil affects the other coil, in general, a configuration is employed that the two coils are arranged horizontally distant from each other. Specifically, one coil is arranged in the vicinity of the subject material (a magnetic material) such as to easily be affected by a change in the magnetic permeability. Then, the other coil is arranged distant from the subject material (the magnetic material) such as to hardly be affected by a change in the magnetic permeability. However, such a configuration that a plurality of coils are arranged horizontally causes a problem that size reduction of the sensor is not achievable.

Further, the magnetic permeability is detected on the basis of changes in the inductances of the plurality of coils. Thus, a large number of circuit components are used for the detection. However, variation is present in the characteristics of the circuit components and further the circuit components are easily affected by the detection environment. Thus, there is a problem that accurate detection is not achievable.

In the sensor employing a piezoelectric element, individual piezoelectric elements have large variation in the threshold at which the oscillation is stopped by contact with the toner (the powder) and in the threshold at which the oscillation is started when the toner (the powder) gradually decreases. Further, such thresholds are largely affected by the state of assembling of the piezoelectric element. Thus, there is a problem that the amount of the toner (the powder) is not accurately detected.

The present invention has been devised in view of such situations. An object thereof is to provide: a magnetic permeability sensor having a small and simple configuration and yet allowed to detect with accuracy a change in the magnetic permeability of a subject material; and a magnetic permeability detecting method employing the magnetic permeability sensor.

Another object of the present invention is to provide: a dielectric permittivity sensor having a small and simple configuration and yet allowed to detect with accuracy a change in the dielectric permittivity of a subject material; and a dielectric permittivity detecting method employing the dielectric permittivity sensor.

Yet another object of the present invention is to provide: a magnetic permeability and dielectric permittivity sensor constructed in the form of one sensor and capable of selectively detecting a change in the magnetic permeability of a subject material or a change in the dielectric permittivity thereof, and a magnetic permeability and dielectric permittivity detecting method employing the magnetic permeability and dielectric permittivity sensor.

The magnetic permeability sensor according to the present invention is characterized by a magnetic permeability sensor detecting a magnetic permeability of a subject material, including: a first oscillation circuit performing oscillation in a state of including a first coil receiving magnetism from the subject material; a second oscillation circuit performing oscillation in a state of including a second coil receiving magnetism from the subject material; measurement means for measuring an oscillation frequency in each of the first oscillation circuit and the second oscillation circuit; calculation means for calculating a difference of the oscillation frequencies measured by the measurement means; and conversion means for converting the difference calculated by the calculation means into a magnetic permeability. Here, to "receive magnetism" indicates to be magnetically linked to the subject material.

In the magnetic permeability sensor according to the present invention, the measurement means measures: the oscillation frequency of the first oscillation circuit including the first coil arranged near the subject material; and the oscillation frequency of the second oscillation circuit including the second coil arranged near the subject material at a to-the-subject-material distance different from that of the first coil. Then, the calculation means calculates the difference of the two oscillation frequencies measured by the measurement means and then the conversion means converts into the magnetic permeability the difference calculated by the calculation means. With increasing magnetic permeability of the subject material, the inductance of the coil increases and hence the oscillation frequency of the oscillation circuit including the coil decreases. Here, the coil closer to the subject material has a larger change in the inductance in correspondence to the change in the magnetic permeability and hence larger variation in the oscillation frequency also is obtained in the oscillation circuit. Thus, when such two coils arrange at different distances to the subject material are employed, the magnetic permeability is allowed to be detected from the difference of the oscillation frequencies in the individual oscillation circuits. At that time, the two coils may be constructed from flat coils like those formed by pattern printing on a substrate. This permits size reduction of the configuration.

A coil having a small inductance like a flat coil has a high oscillation frequency. As a result, the clock frequency of a computer is lower than the oscillation frequency. Thus, in the case of frequency measurement, the measurement time used for obtaining the same resolution is allowed to be shortened and the measurement time is allowed to be fixed.

Further, the series of processing consisting of measurement of the oscillation frequencies, calculation of the difference of the oscillation frequencies, and conversion of the difference into the magnetic permeability is allowed to be performed by software by employing a microcomputer or the like. This reduces the number of employed components and further avoids the influence of variation in the characteristics of the components so as to achieve a high detection accuracy.

The magnetic permeability sensor according to the present invention is characterized in that the measurement means is constructed such as to alternately measure the oscillation frequency in the first oscillation circuit and the oscillation frequency in the second oscillation circuit.

In the magnetic permeability sensor according to the present invention, the measurement of the oscillation frequency in the first oscillation circuit and the measurement of the oscillation frequency in the second oscillation circuit are switched to each other and performed alternately. Thus, at the time of measurement of the oscillation frequency in one oscillation circuit, the other oscillation circuit is not caused to oscillate. Accordingly, the measured value of the oscillation frequency in one oscillation circuit is not affected by the oscillation of the other oscillation circuit. This permits measurement of accurate oscillation frequencies in the two oscillation circuits and hence provides a high detection accuracy in the magnetic permeability.

The magnetic permeability sensor according to the present invention is characterized in that the first coil and the second coil are arranged in a coaxial manner to each other.

In the magnetic permeability sensor according to the present invention, the first coil and the second coil are arranged in a coaxial manner to each other. Thus, a small area is sufficient for arrangement of the coils and hence size reduction of the magnetic permeability sensor is achieved.

The magnetic permeability sensor according to the present invention is characterized in that component members of the first oscillation circuit and the second oscillation circuit are shared with each other except for the first coil and the second coil.

In the magnetic permeability sensor according to the present invention, in the first oscillation circuit and the second oscillation circuit, component members other than the first coil and the second coil are shared with each other. Thus, the oscillation frequency measured in each of the first oscillation circuit and the second oscillation circuit is not affected by variation in the characteristics that could be caused if component members other than the coil were different from each other. Accordingly, an accurate measured value is obtained and hence a high detection accuracy is achieved in the magnetic permeability.

The magnetic permeability sensor according to the present invention is characterized by further comprising a substrate on one face of which the first coil is arranged and on the other face of which the second coil is arranged.

In the magnetic permeability sensor according to the present invention, the first coil is formed on one face of the substrate and the second coil is formed on the other face of the substrate. Thus, a simple configuration realizes the coaxial arrangement of the first coil and the second coil.

The magnetic permeability detecting method according to the present invention is characterized by a magnetic permeability detecting method of detecting a magnetic permeability of a subject material, including steps of: arranging the first coil and the second coil such that distances thereof from the subject material are different from each other; measuring each of an oscillation frequency of an oscillation circuit performing oscillation in a state of including the first coil and an oscillation frequency of an oscillation circuit performing oscillation in a state of including the second coil; calculating a difference of the measured oscillation frequencies; and converting the calculated difference into a magnetic permeability.

The dielectric permittivity sensor according to the present invention is characterized by a dielectric permittivity sensor detecting a dielectric permittivity of a subject material, including: a first oscillation circuit performing oscillation in a state of including a first capacitor arranged in a region where the subject material is located; a second oscillation circuit performing oscillation in a state of including a second capacitor arranged in a region where the subject material is not located; measurement means for measuring an oscillation frequency in each of the first oscillation circuit and the second oscillation circuit; calculation means for calculating a difference of the oscillation frequencies measured by the measurement means; and conversion means for converting the difference calculated by the calculation means into a dielectric permittivity.

In the dielectric permittivity sensor according to the present invention, the measurement means measures: the oscillation frequency of the first oscillation circuit including the first capacitor arranged in a region where the subject material is located; and the oscillation frequency of the second oscillation circuit including the second capacitor arranged in a region where the subject material is not located. The calculation means calculates the difference of the two oscillation frequencies measured by the measurement means and then the conversion means converts into the dielectric permittivity the difference calculated by the calculation means. With increasing amount of the subject material, the dielectric permittivity increases and hence the electrostatic capacitance of the first capacitor increases. As a result, the oscillation frequency of the first oscillation circuit decreases. Thus, the dielectric permittivity is allowed to be detected from the difference of the oscillation frequencies in the individual oscillation circuits.

The dielectric permittivity sensor according to the present invention is characterized in that the first capacitor includes a pair of electrodes provided in the region where the subject material is located and the second capacitor includes a pair of electrodes provided in the region where the subject material is not located.

In the dielectric permittivity sensor according to the present invention, the first capacitor is formed by a pair of electrodes provided in the region where the subject material is located and the second capacitor is formed by a pair of electrodes provided in the region where the subject material is not located.

The dielectric permittivity sensor according to the present invention is characterized in that the first capacitor includes one electrode provided in the region where the subject material is located.

In the dielectric permittivity sensor according to the present invention, the first capacitor is formed by the one electrode provided in the region where the subject material is located and by a virtual electrode in the outside.

The dielectric permittivity detecting method according to the present invention is characterized by a dielectric permittivity detecting method of detecting a dielectric permittivity of a subject material, including steps of: arranging a first capacitor in a region where the subject material is located and arranging a second capacitor in a region where the subject material is not located; measuring each of an oscillation frequency of an oscillation circuit performing oscillation in a state of including the first capacitor and an oscillation frequency of an oscillation circuit performing oscillation in a state of including the second capacitor; calculating a difference of the measured oscillation frequencies; and converting the calculated difference into a dielectric permittivity.

The magnetic permeability and dielectric permittivity sensor according to the present invention is characterized by a magnetic permeability and dielectric permittivity sensor selectively detecting a magnetic permeability or a dielectric permittivity of a subject material, including: a first oscillation circuit performing oscillation in a state of including a coil and a capacitor; a second oscillation circuit performing oscillation in a state of including a coil and a capacitor different from the coil and the capacitor of the first oscillation circuit; measurement means for measuring an oscillation frequency in each of the first oscillation circuit and the second oscillation circuit; calculation means for calculating a difference of the oscillation frequencies measured by the measurement means; and conversion means for converting the difference calculated by the calculation means into a magnetic permeability or a dielectric permittivity.

In the magnetic permeability and dielectric permittivity sensor according to the present invention, the measurement means measures the oscillation frequency of the first oscillation circuit and the oscillation frequency of the second oscillation circuit. Then, the calculation means calculates the difference of the two measured oscillation frequencies and then the conversion means converts the calculated difference into the magnetic permeability or the dielectric permittivity. In each of the case that the magnetic permeability of the subject material is to be detected and the case that the dielectric permittivity of the subject material is to be detected, the measurement processing in the measurement means, the calculation processing in the calculation means, and the conversion processing in the conversion means are similar to each other. Thus, the magnetic permeability or the dielectric permittivity is selectively detected by the one sensor.

The magnetic permeability and dielectric permittivity detecting method according to the present invention is characterized by a magnetic permeability and dielectric permittivity detecting method of selectively detecting a magnetic permeability or a dielectric permittivity of a subject material, including steps of: measuring each of an oscillation frequency of a first oscillation circuit performing oscillation in a state of including a coil and a capacitor and an oscillation frequency of a second oscillation circuit performing oscillation in a state of including a coil and a capacitor different from the coil and the capacitor of the first oscillation circuit; calculating a difference of the measured oscillation frequencies; and converting the calculated difference into a magnetic permeability or a dielectric permittivity.

In the present invention, even a small and simple configuration is allowed to detect with accuracy the magnetic permeability of the subject material.

In the present invention, even a small and simple configuration is allowed to detect with accuracy the dielectric permittivity of the subject material.

In the present invention, one sensor is allowed to selectively perform detection of the magnetic permeability of a subject material and detection of the dielectric permittivity thereof in a switching manner.

The above and further objects and features will more fully be apparent from the following detailed description with accompanying drawings.

BRIEF DESCRIPTION OF THE DRAWINGS

FIG. 12 is a sectional view illustrating a configuration of a magnetic permeability sensor according to a third modification.

FIG. 14 is a sectional view illustrating a configuration of a magnetic permeability sensor according to a fifth modification.

FIG. 24 is a plan view illustrating a shape of a positive electrode.

DETAILED DESCRIPTION

First Embodiment

Figure 1:
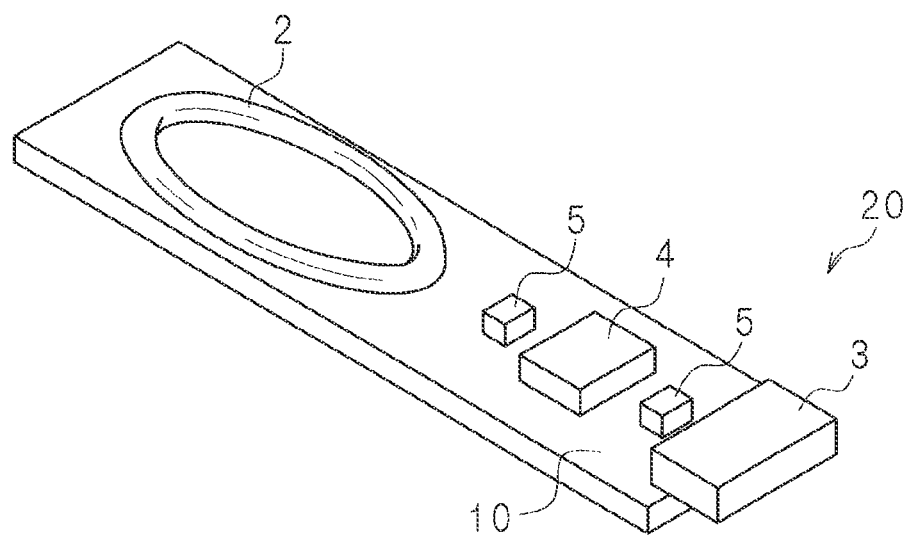
FIG. 1 is a perspective view illustrating a configuration of a magnetic permeability sensor according to the present invention.
Figure 2:
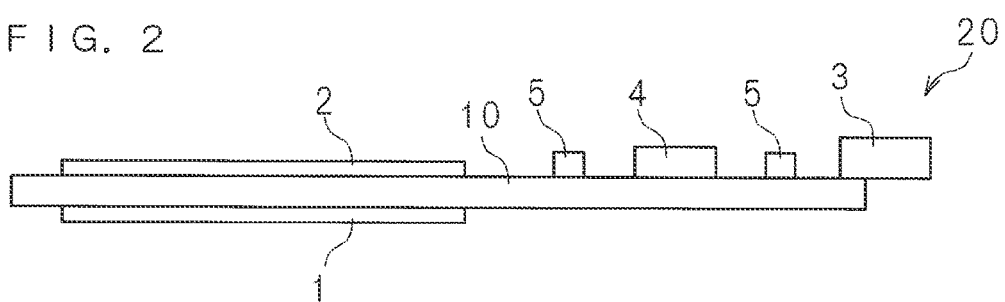
FIG. 2 is a sectional view illustrating a configuration of a magnetic permeability sensor according to the present invention.

The present invention is described below in detail with reference to the drawings illustrating embodiments. FIGS. 1 and 2 are a perspective view and a sectional view illustrating the configuration of a magnetic permeability sensor according to the present invention.

In FIGS. 1 and 2, numeral 10 indicates a substrate having a flat rectangular shape. A first coil 1 is formed on one face (a lower face) of one end part of the substrate 10 (see FIG. 2). Further, a second coil 2 is formed on the other face (an upper face) of the one end part of the substrate 10 in a coaxial manner relative to the first coil 1. For example, the first coil 1 and the second coil 2 are formed by printing of copper foil patterns onto the substrate 10.

On the upper face of the other end part of the substrate 10, a connector 3 is mounted in a state that a part thereof protrudes from the other end. On the upper face of the center part of the substrate 10, an electronic chip 4 is mounted that is constructed from a microcomputer performing various kinds of processing described later. Further, circuit components 5 are mounted near the electronic chip 4. The circuit components 5 include a capacitor and the like constituting an oscillation circuit together with the first coil 1 or the second coil 2. A magnetic permeability sensor 20 of the present invention has the above-described configuration.

Figure 3:
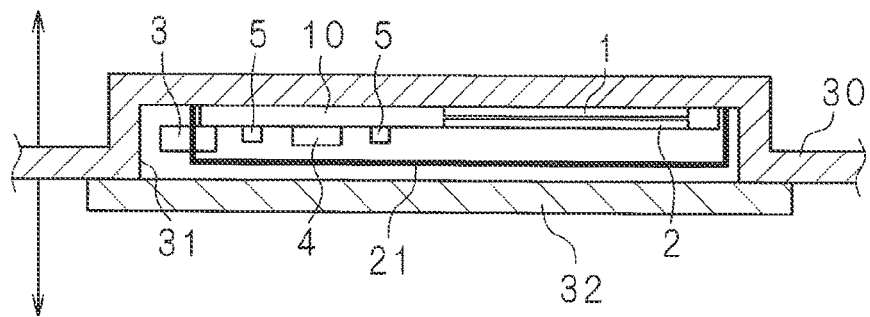
FIG. 3 is a sectional view illustrating an example of attachment of a magnetic permeability sensor according to the present invention to a development unit.

FIG. 3 is a sectional view illustrating an example of attachment of the magnetic permeability sensor 20 according to the present invention to a development unit. Numeral 30 in FIG. 3 indicates a partition separating the inside and the outside of the development unit from each other. A recess 31 is formed in the partition 30. Then, the magnetic permeability sensor 20 is attached to the development unit in a state of being contained in a housing 21 and then fitted into the recess 31. Here, the tip part of the connector 3 protrudes from the housing 21.

At that time, the magnetic permeability sensor 20 is attached to the partition 30 of the development unit in a manner that the lower face side of the substrate 10 illustrated in FIGS. 1 and 2 is oriented to the partition 30 side. Thus, the first coil 1 is located at a position closer to the inside of the development unit, that is, at a position closer to the developing powder in the development unit, than the second coil 2 is located. The recess 31 to which the magnetic permeability sensor 20 is attached is closed by a seal 32.

Figure 4:
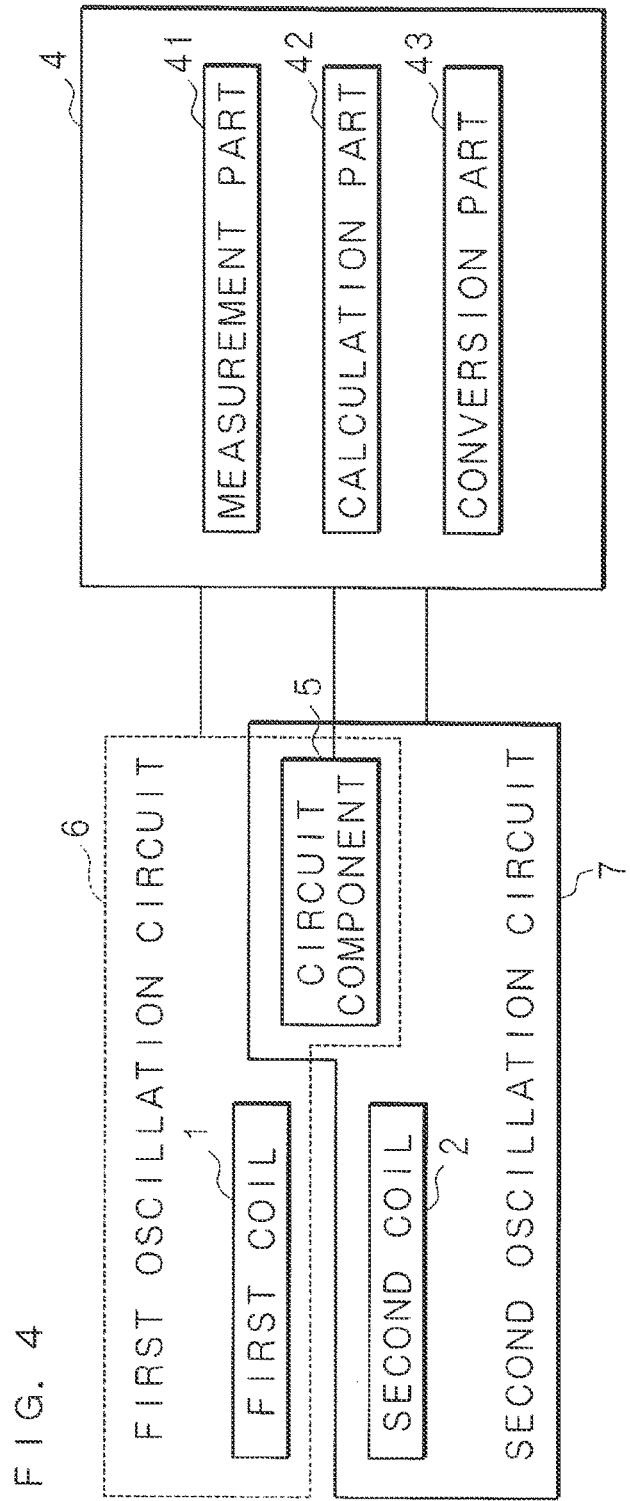
FIG. 4 is a block diagram illustrating a functional configuration of a magnetic permeability sensor according to the present invention.

FIG. 4 is a block diagram illustrating the functional configuration of the magnetic permeability sensor 20 according to the present invention. In FIG. 4, like components to those in FIGS. 1 and 2 are designated by like numerals.

The first coil 1 and a part of the circuit components 5 constitute a first oscillation circuit 6 and the second coil 2 and a part of the circuit components 5 constitute a second oscillation circuit 7. In the magnetic permeability sensor 20 according to the present invention, in the first oscillation circuit 6 and the second oscillation circuit 7, component members other than the first coil 1 and the second coil 2 are shared with each other. Thus, the oscillation frequency measured in each of the first oscillation circuit 6 and the second oscillation circuit 7 is not affected by variation in the characteristics that could be caused if component members were different from each other. Accordingly, an accurate measured value is obtained and hence a high detection accuracy is achieved in the magnetic permeability.

Further, the electronic chip 4 functionally includes: a measurement part 41 measuring an oscillation frequency in each of the first oscillation circuit 6 and the second oscillation circuit 7; a calculation part 42 calculating a difference of the oscillation frequencies measured by the measurement part 41; and a conversion part 43 converting into the magnetic permeability the difference calculated by the calculation part 42.

Figure 5:
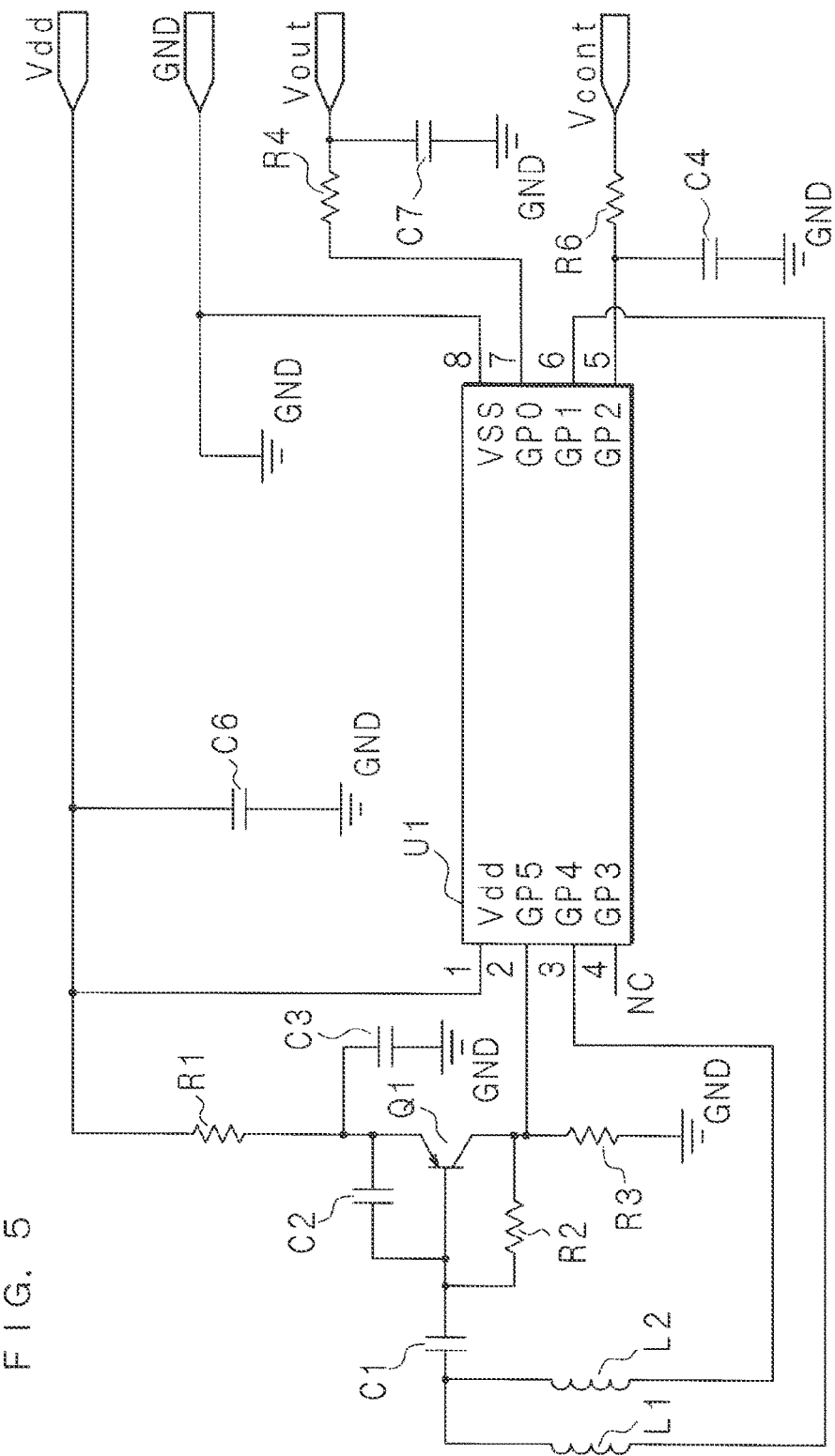
FIG. 5 is a circuit diagram illustrating an exemplary configuration of a magnetic permeability sensor according to the present invention.

FIG. 5 is a circuit diagram illustrating an exemplary configuration of the magnetic permeability sensor 20 according to the present invention. In FIG. 5, a coil L1 and a coil L2 respectively correspond to the first coil 1 and the second coil 2 described above. Further, a microcomputer U1 corresponds to the electronic chip 4 described above.

One end of the coil L1 is connected to a sixth terminal of the microcomputer U1 and one end of the coil L2 is connected to a third terminal of the microcomputer U1. The other end of the coil L1 and the other end of the coil L2 are connected through a capacitor C1 to the base of a transistor Q1. A resistor R2 is provided between the base and the collector of the transistor Q1 and then a capacitor C2 is provided between the base and the emitter of the transistor Q1. The collector of the transistor Q1 is connected to a second terminal of the microcomputer U1 and, at the same time, grounded through a resistor R3.

An input terminal of a supply voltage Vdd is connected to a first terminal of the microcomputer U1. The input terminal of the supply voltage Vdd is connected through a resistor R1 to the emitter of the transistor Q1. One end of a capacitor C3 is connected between the resistor R1 and the emitter of the transistor Q1 and then the other end of the capacitor C3 is grounded. One end of a capacitor C6 is connected between the input terminal of the supply voltage Vdd and the first terminal and then the other end of the capacitor C6 is grounded. A terminal for grounding is connected to an eighth terminal of the microcomputer U1.

An output terminal through which a detection voltage Vout corresponding to the magnetic permeability is outputted is connected through a resistor R4 to a seventh terminal of the microcomputer U1. One end of a capacitor C7 is connected between the output terminal and the resistor R4 and then the other end of the capacitor C7 is grounded. An input terminal through which a control voltage Vcont for offset control is inputted is connected through a resistor R6 to a fifth terminal of the microcomputer U1. One end of a capacitor C4 is connected between the fifth terminal of the microcomputer U1 and the resistor R6 and then the other end of the capacitor C4 is grounded.

The coil L1, the two capacitors C2 and C3, and the transistor Q1 constitute the first oscillation circuit 6 (a Colpitts oscillator) described above and the coil L2, the two capacitors C2 and C3, and the transistor Q1 constitute the second oscillation circuit 7 (a Colpitts oscillator) described above. Then, in association with switching operation of the microcomputer U1 (switching operation is performed between the third terminal and the sixth terminal of the microcomputer U1), the first oscillation circuit 6 and the second oscillation circuit 7 perform oscillation alternately for a predetermined time each.

Figure 6:
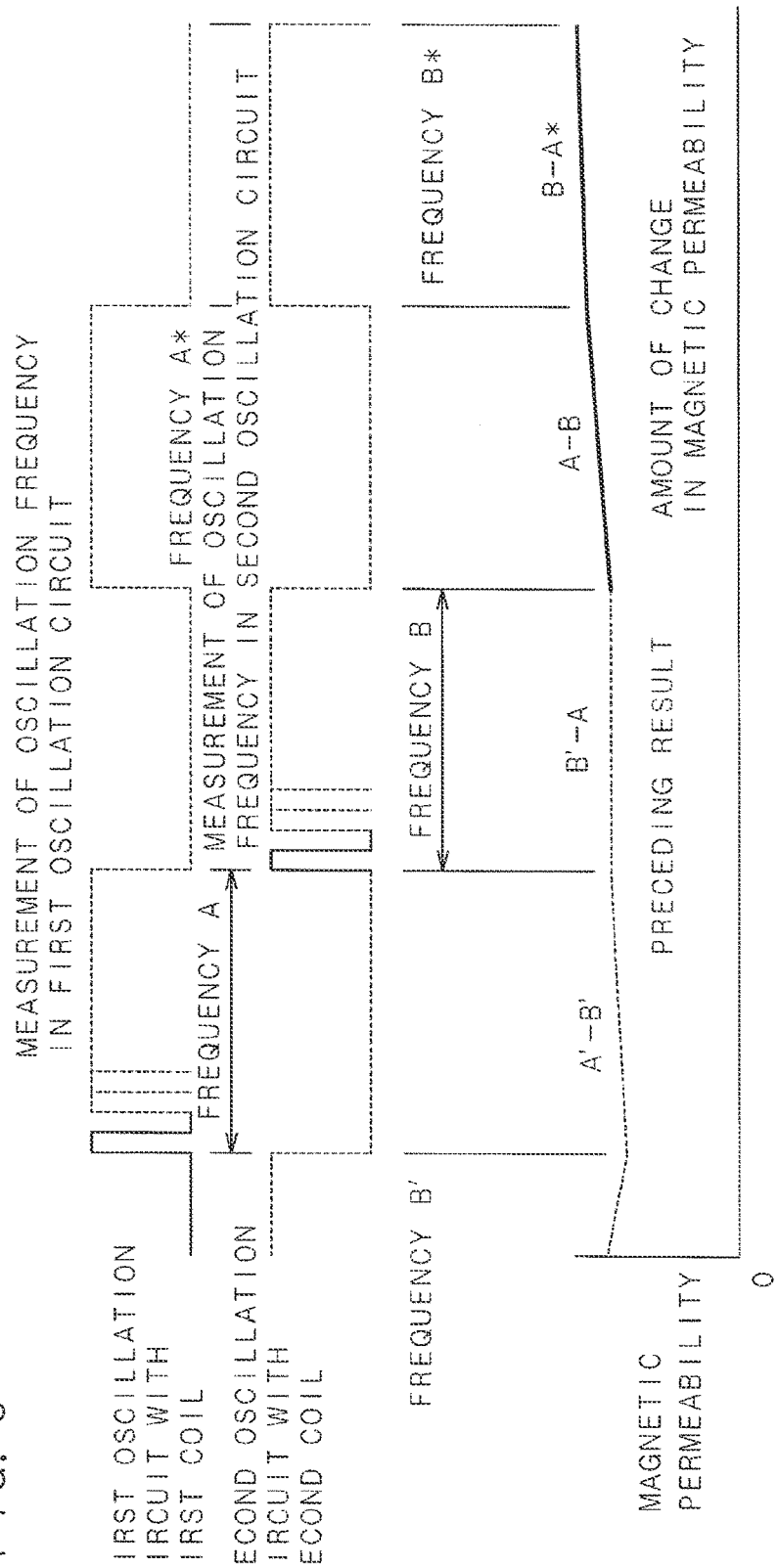
FIG. 6 is a timing chart describing operation of a magnetic permeability sensor according to the present invention.

Next, operation of the magnetic permeability sensor 20 of the present invention is described below. FIG. 6 is a timing chart describing the operation of the magnetic permeability sensor 20 according to the present invention.

The first oscillation circuit 6 and the second oscillation circuit 7 are caused to oscillate alternately for a predetermined time each and then the oscillation frequency in each oscillation is measured by the measurement part 41. For example, the predetermined time is 2 ms. At that time, as illustrated in FIG. 6, during the time that the first oscillation circuit 6 is caused to oscillate and the oscillation frequency is measured, the second oscillation circuit 7 is not caused to oscillate. Further, during the time that the second oscillation circuit 7 is caused to oscillate and the oscillation frequency is measured, the first oscillation circuit 6 is not caused to oscillate. Thus, the oscillation frequency is measured without an influence from the oscillation of the other circuit and hence an accurate measured value is obtained.

When measurement of the oscillation frequencies for a predetermined time (e.g., 2 ms) each has been completed, the calculation part 42 calculates the difference between the measured oscillation frequency in the first oscillation circuit 6 (resulting from the first coil 1) and the measured oscillation frequency in the second oscillation circuit 7 (resulting from the second coil 2). Then, the conversion part 43 converts the calculated difference into the magnetic permeability so as to obtain the amount of change in the magnetic permeability. The magnetic permeability sensor (the toner sensor) 20 attached to the development unit detects the concentration of the toner.

Further, during the time that the first oscillation circuit 6 is caused to oscillate and the oscillation frequency is measured, the calculation part 42 calculates the difference between the previously measured values (e.g., A' and B') of the first oscillation circuit 6 and the second oscillation circuit 7. Then, the conversion part 43 converts the calculated difference into the magnetic permeability so as to obtain the amount of change in the magnetic permeability. Thus, the amount of change in the magnetic permeability is successively updated at the timing of start of measurement of the oscillation frequency of each oscillation circuit.

The following advantages are obtained in the present invention. In some cases, the control range of the toner concentration varies depending on the kind of the toner employed. In such cases, an offset function may be provided that for example, a not-yet-used terminal of the microcomputer U1 is utilized such that the voltage level of the not-yet-used terminal is controlled from the outside and thereby the control range of the toner concentration is adjusted to an appropriate range for the toner to be used.

Further, in recent years, there is a tendency that in certain electrophotography systems, the grain diameter of the toner itself is made small for the purpose of obtaining a high image quality. Further, there is another tendency that the amount of useless toner is reduced as much as possible so that a low cost and weight reduction is aimed at. This causes a tendency that a detected change in the magnetic permeability becomes small. In order that the change in the magnetic permeability having become small may accurately be detected, the measurement sensitivity is to be increased by a method such as amplification for magnifying the small change in the magnetic permeability. At the time, in some cases, linearity in the change in the magnetic permeability is lost and hence accurate measurement of the magnetic permeability is not achievable. However, according to the present invention, a method utilizing software such as linearity correction is employed so that the unsatisfactory linearity is improved and hence the change in the magnetic permeability is allowed to be accurately recognized.

Here, in the present invention, the difference of the oscillation frequencies of the first oscillation circuit and the second oscillation circuit is calculated. Instead, each oscillation frequency may be converted into the magnetic permeability by arithmetic processing.

Here, in FIG. 5, a microcomputer including eight terminals has been illustrated as an example. However, employable configurations are not limited to this. That is, when required, a microcomputer including a different number of terminals may be employed. Then, the microcomputer may transmit information such as a change in the magnetic permeability to an upper-level control side by means of serial communication or the like and may receive a control signal from the upper-level control side.

The flowing description is performed for the principles that the magnetic permeability is allowed to be detected (the toner concentration is allowed to be detected) by the procedure described above.

When the magnetic permeability of a subject material increases, the inductance of a coil arranged near the subject material increases in correspondence to the change in the magnetic permeability. As a result, the oscillation frequency of the oscillation circuit including the coil decreases. Here, when two coils are arranged at different distances from the subject material, the inductance increases in each of the coils and hence the oscillation frequency decreases in each of the oscillation circuits. However, the coil closer to the subject material is more strongly affected by the change in the magnetic permeability than the more distant coil. Thus, in the case described above, a larger amount of increase in the inductance is caused and hence a larger amount of decrease in the oscillation frequency is caused. Thus, in the oscillation frequencies in the two oscillation circuits each including each of the two coils, a difference is generated in correspondence to the amount of change in the magnetic permeability. As such, a correlation is present between the difference of the oscillation frequencies and the magnetic permeability. Thus, according to the present invention, the magnetic permeability of the subject material is allowed to be detected on the basis of the difference of the oscillation frequencies of the two oscillation circuits. The coil closer to the subject material is regarded as a coil for detection and the coil more distant from the subject material is regarded as a coil for reference.

In the magnetic permeability sensor 20 in the embodiment described above, the first coil 1 corresponds to the above-described coil closer to the subject material and the second coil 2 corresponds to the above-described coil more distant from the subject material.

The developing powder in the development unit is fabricated by mixing toner with carrier (a magnetic material (iron powder or ferrite powder) is covered with resin or the like). At the time of copying, the toner adheres to the paper sheet and the magnetic material (the carrier) does not. Thus, with the progress of copy processing, the amount of toner decreases but the amount of magnetic material hardly varies. Accordingly, the magnetic permeability of the developing powder increases. That is, there is an inversely proportional correlation between the magnetic permeability in the development unit and the concentration of the toner. In the present invention, as described above, the magnetic permeability of the subject material (the developing powder) is allowed to be detected and hence on the basis of the detected magnetic permeability of the developing powder in the development unit, the concentration of the toner is allowed to be detected.

In the embodiment described above, a change in the inductances of the two coils (the first coil 1 and the second coil 2) arranged on the substrate 10 in a coaxial manner to each other is detected as the difference of the oscillation frequencies in the two oscillation circuits (the first oscillation circuit 6 and the second oscillation circuit 7) driven by an accurate clock signal provided from an oscillator built in the microcomputer (the electronic chip 4). Then, the microcomputer performs arithmetic processing on the difference (the amount of change in the oscillation frequencies) so as to detect a change in the magnetic permeability. Here, the two coils are alternately connected to the oscillation circuit. Then, the microcomputer alternately measures the oscillation frequency of each oscillation circuit for a predetermined time each and then calculates the difference so as to detect the change in the magnetic permeability.

In the present embodiment, the first coil 1 and the second coil 2 are arranged on the upper and the lower face of the substrate 10 in a coaxial manner to each other. This reduces the area used for arrangement of the coils and hence achieves miniaturization in the horizontal directions. Further, the coils are formed by printing conductor patterns on the substrate 10. Thus, size reduction in the height direction is achieved. Further, various kinds of processing is performed by employing a microcomputer. Thus, the number of employed components is allowed to be reduced and the area used for mounting the circuit components is allowed to be reduced. Such situations described above permit remarkable size reduction of the magnetic permeability sensor.

Measures of the oscillation frequencies of the two oscillation circuits is performed alternately. Thus, measurement for the oscillation circuit including one coil is not affected by a magnetic flux generated by the other coil (an inductance change in the other coil) and hence accurate oscillation frequencies are allowed to be measured. By virtue of this, the magnetic permeability is allowed to be detected with accuracy.

In the present embodiment, the transistor and the capacitors constituting the two oscillation circuits are shared and then each coil is arranged to each oscillation circuit. Thus, the number of employed components is reduced and hence cost reduction is achieved. Further, since the number of employed components is reduced, variation in the component characteristics is allowed to be reduced. Furthermore, the influence of external disturbance such as a temperature change and a noise is hardly caused and hence accurate measurement is achieved.

Various kinds of processing is performed by software by employing a microcomputer. Thus, the number of circuit components constituting the hardware is allowed to be decreased and hence a situation that the influence of variation in the characteristics of the circuit components is caused is allowed to be reduced. Further, since the processing is performed by the software, the influence of the environment (the temperature, the humidity, or the like) is hardly caused. This improves the accuracy of the detected magnetic permeability.

Further, even when a different concentration of the toner is set up, the situation is allowed to be easily handled merely by changing the contents of software. This avoids a situation that management is to be performed for each different setting value of the toner concentration. Thus, mass production becomes easy and hence cost reduction is achieved.

Next, comparison of the characteristics (detection of the toner concentration) between an example of the present invention and an example of the conventional art is described below. The magnetic permeability sensor (a toner sensor) according to an example of the present invention has the configuration illustrated in FIGS. 1 and 2 described above and is attached to a development unit as illustrated in FIG. 3 described above.

Figure 7:
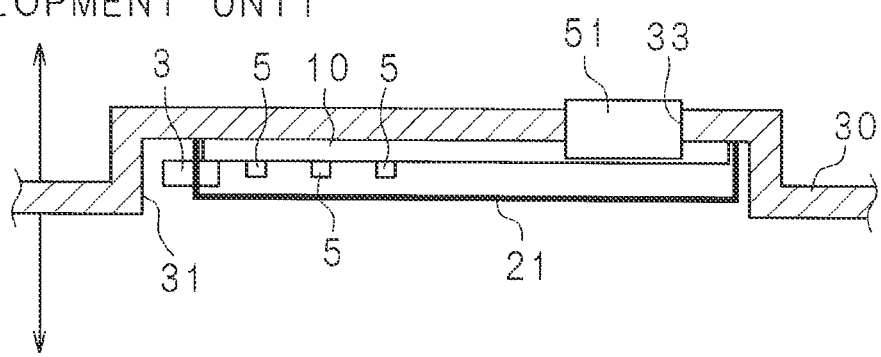
FIG. 7 is a sectional view illustrating an example of attachment of a magnetic permeability sensor of a conventional example to a development unit.

FIG. 7 is a sectional view illustrating an example of attachment of a magnetic permeability sensor of a conventional example to a development unit. In FIG. 7, like components to those in FIG. 3 are designated by like numerals.

A differential transformer 51 is provided on the upper face side in one end part of the substrate 10. The differential transformer 51 is constructed from: a drive coil on which an oscillation signal of alternating current is applied; and a differential coil (a reference coil and a detection coil) linked to the drive coil. In the partition 30, a hole 33 is formed at a position opposite to the differential transformer 51. Then, a part (the detection coil side) of the differential transformer 51 protrudes from the hole 33 so that the detection coil is in direct contact with the developing powder in the development unit. On the lower face of the other end part of the substrate 10, a connector 3 is formed in a state that a part thereof protrudes from the other end. Further, various kinds of circuit components 5 are mounted on the lower face of the center part of the substrate 10. The magnetic permeability sensor having this configuration is attached to a recess 31 of the partition 30 in a state of being contained in the housing 21.

In the magnetic permeability sensor of the conventional example, the differential transformer 51 protrudes. This causes an inconvenience that the shape of the housing 21 is complicated. Further, the construction is larger in size in comparison with an example of the present invention. Further, the hole 33 formed in the partition 30 causes a possibility of leakage of the developing powder.

Figure 8:
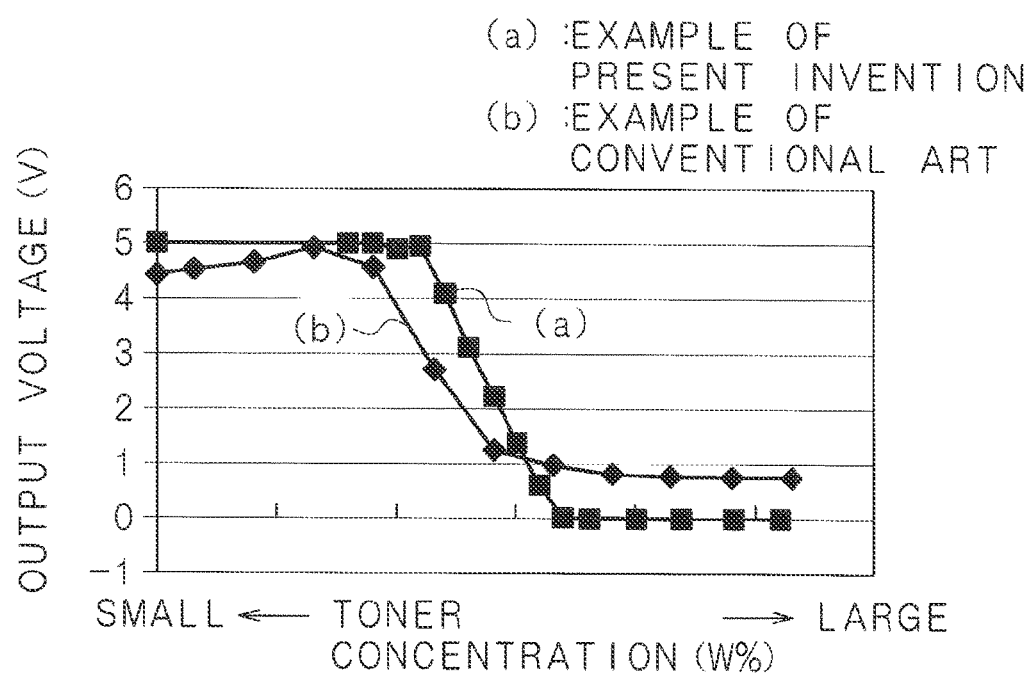
FIG. 8 is a graph describing characteristics of a toner concentration detection sensitivity in an example of the present invention and an example of the conventional art.

FIG. 8 is a graph describing the characteristics of the toner concentration detection sensitivity in an example of the present invention and an example of the conventional art. In FIG. 8, the horizontal axis indicates the toner concentration and the vertical axis indicates the output voltage serving as a detection result of the magnetic permeability. Further, the curves (a) and (b) in FIG. 8 describe the characteristics of the example of the present invention and of the example of the conventional art, respectively.

When the example of the present invention is compared with the example of the conventional art, in the example of the present invention, the portion where the output voltage linearly varies in response to the change of the toner concentration is wider than in the example of the conventional art. Thus, it is concluded that the detection accuracy in the example of the present invention is more satisfactory than that of the example of the conventional art.

Figure 9:
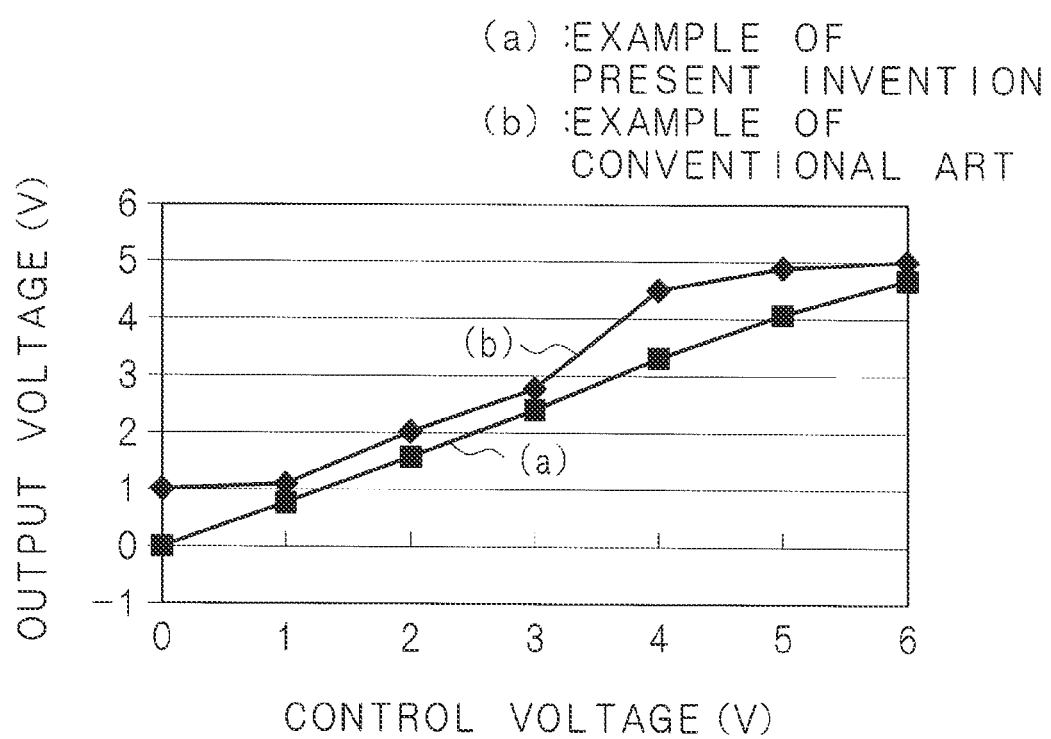
FIG. 9 is a graph describing characteristics of a control voltage used for offset control in an example of the present invention and an example of the conventional art.

FIG. 9 is a graph describing the characteristics of the control voltage used for offset control in an example of the present invention and an example of the conventional art. In FIG. 9, the horizontal axis indicates the applied control voltage and the vertical axis indicates the output voltage. Further, the curves (a) and (b) in FIG. 9 describe the characteristics of the example of the present invention and of the example of the conventional art, respectively.

When the example of the present invention is compared with the example of the conventional art, in the example of the conventional art, the output voltage linearly varies in response to the change of the control voltage only in a part. In contrast, in the example of the present invention, the output voltage linearly varies in response to the change of the control voltage over the entirety. Thus, it is concluded that the accuracy of offset control in the example of the present invention is more satisfactory than that of the example of the conventional art.

Meanwhile, in the embodiment described above, the magnetic permeability sensor 20 has been attached to the development unit in a state of being contained in the housing 21. In contrast, in the present invention, since there is no possibility of leakage of the developing powder, the housing 21 may be not provided. In such a case, it is sufficient that notches are provided at a plurality of locations of the substrate 10 and then claws provided in the development unit are hooked to the notches so that the magnetic permeability sensor 20 is attached to the development unit or, alternatively, that the substrate 10 and the partition 30 are bonded together by using a double-sided tape so that the magnetic permeability sensor 20 is attached to the development unit.

In the embodiment described above, conductor patterns have been printed individually on the upper face and the lower face of the substrate 10 so that the first coil 1 and the second coil 2 have been formed in a coaxial manner to each other. However, employable techniques of forming the first coil 1 and the second coil 2 is not limited to this and other techniques may be employed. Such other techniques are described below as modifications.

(First Modification)

Figure 10:
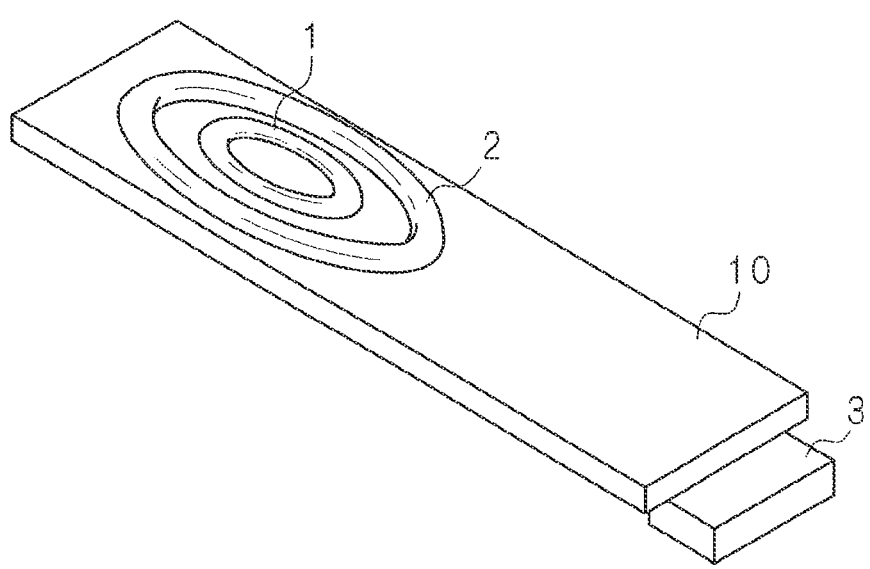
FIG. 10 is a perspective view illustrating a configuration of a coil according to a first modification.

FIG. 10 is a perspective view illustrating the configuration of a coil according to a first modification. In FIG. 10, like components to those in FIGS. 1 and 2 are designated by like numerals. Here, FIG. 10 illustrates a situation that the upper and the lower face of the substrate 10 are inverted in comparison with FIG. 1. In the first modification, on the lower face of the substrate 10, a first coil 1 and a second coil 2 are formed in the shape of concentric circles, for example, by pattern printing of a copper foil. On the upper face of the substrate 10, no coil is formed and an electronic chip 4, circuit components 5, and a connector 3 similar to those of the embodiment described above are mounted.

(Second Modification)

Figure 11:
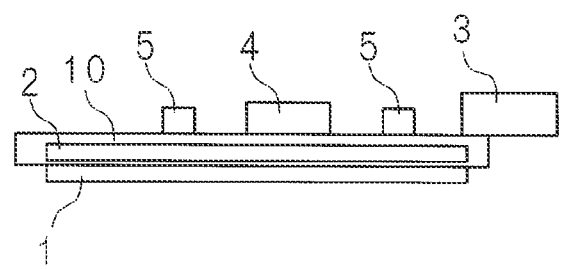
FIG. 11 is a sectional view illustrating a configuration of a magnetic permeability sensor according to a second modification.

FIG. 11 is a sectional view illustrating the configuration of a magnetic permeability sensor according to a second modification. In FIG. 11, like components to those in FIGS. 1 and 2 are designated by like numerals. In the second modification, on the lower face of the substrate 10, a first coil 1 and a second coil 2 are stacked and formed in a coaxial manner to each other with an insulating layer in between, for example, by pattern printing of a copper foil. Further, on the upper face of the substrate 10, no coil is formed and an electronic chip 4, circuit components 5, and a connector 3 similar to those of the embodiment described above are mounted. The first coil 1 and the second coil 2 are formed immediately under the mounting position of the electronic chip 4 and the circuit components 5. Thus, further size reduction of the configuration of the magnetic permeability sensor is achieved. Here, in contrast to the configuration illustrated in FIG. 11, the first coil 1 and the second coil 2 having the shape of concentric circles as described in the first modification described above may be formed immediately under the mounting position of the electronic chip 4 and the circuit components 5.

(Third Modification)

FIG. 12 is a sectional view illustrating the configuration of a magnetic permeability sensor according to a third modification. In FIG. 12, like components to those in FIGS. 1 and 2 are designated by like numerals. In the third modification, on the lower face of one end part of the substrate 10, an air core coil in a separate form is mounted so that a first coil 1 is formed. Then, on the upper face of the one end part of the substrate 10, an air core coil in a separate form is mounted in a coaxial manner relative to the first coil 1 so that a second coil 2 is formed. In the other region on the upper face of the substrate 10, an electronic chip 4, circuit components 5, and a connector 3 similar to those of the embodiment described above are mounted.

(Fourth Modification)

Figure 13:
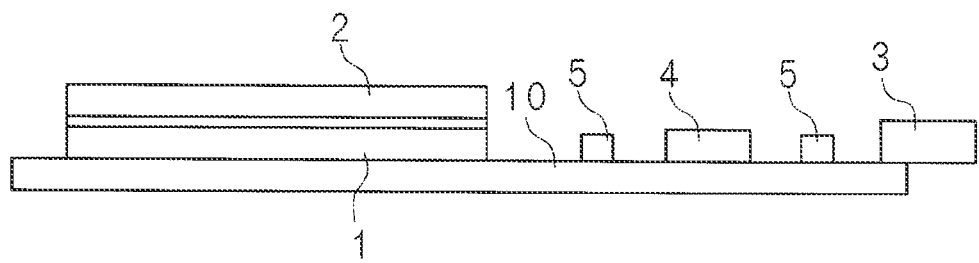
FIG. 13 is a sectional view illustrating a configuration of a magnetic permeability sensor according to a fourth modification.

FIG. 13 is a sectional view illustrating the configuration of a magnetic permeability sensor according to a fourth modification. In FIG. 13, like components to those in FIGS. 1 and 2 are designated by like numerals. In the fourth modification, two air core coils in a separate form are stacked and mounted on the upper face of one end part of the substrate 10 so that a first coil 1 and a second coil 2 are formed. In the other region on the upper face of the substrate 10, an electronic chip 4, circuit components 5, and a connector 3 similar to those of the embodiment described above are mounted. Here, in contrast to the configuration illustrated in FIG. 13, the first coil 1 and the second coil 2 having the configuration of stack of two air core coils as described above may be formed on the lower face of the substrate 10.

(Fifth Modification)

FIG. 14 is a sectional view illustrating the configuration of a magnetic permeability sensor according to a fifth modification. In FIG. 14, like components to those in FIGS. 1 and 2 are designated by like numerals. In the fifth modification, on the lower face of one end part of the substrate 10, a plurality of chip coils are mounted so that a first coil 1 is formed. Then, on the upper face of the one end part of the substrate 10, a plurality of chip coils are mounted in a coaxial manner relative to the first coil 1 so that a second coil 2 is formed. In the other region on the upper face of the substrate 10, an electronic chip 4, circuit components 5, and a connector 3 similar to those of the embodiment described above are mounted.

In the present invention, the first coil and the second coil may be covered by an electrostatic shield. Each coil employed in the present invention is an air core coil. Thus, when a material having a similar dielectric permittivity is located near the coil, in some cases, a change in the electrostatic capacitance causes variation in the measured value. In such cases, when the coil is covered by a shielding member fabricated from copper or the like, the influence from the outside is allowed to be avoided. However, in the case of the magnetic permeability sensor according to the present invention, it is expected that a change in the magnetic permeability, that is, a change in the magnetic force line, causes an eddy current in the shielding member and then the eddy current causes a measurement error in the magnetic permeability sensor. Thus, a shielding member constructed with consideration of countermeasure against the eddy current is to be provided.

Figure 15A:
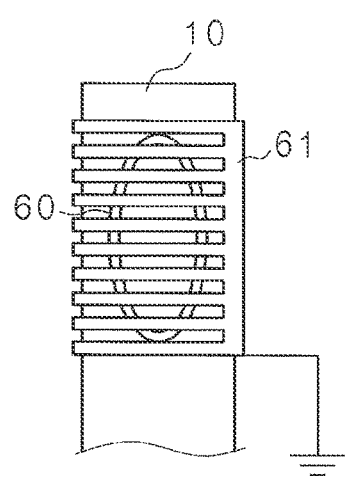
FIGS. 15A to 15C are plan views each illustrating a configuration of a shielding member suitable for a magnetic permeability sensor according to the present invention.
Figure 15B:
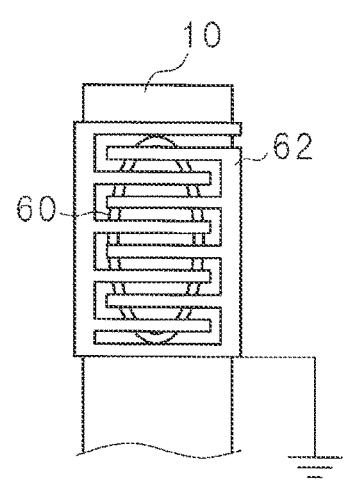
Figure 15C:
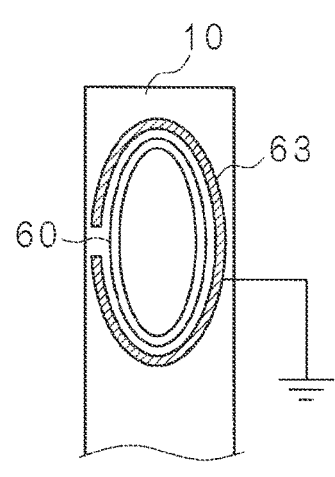

FIGS. 15A to 15C are plan views each illustrating the configuration of a shielding member suitable for the magnetic permeability sensor according to the present invention. In the example illustrated in FIG. 15A, a copper-fabricated shielding member 61 having a shape that a plurality of comb teeth extend in the same direction is provided above a coil 60 formed on the substrate 10. The shielding member 61 is grounded. Further, in the example illustrated in FIG. 15B, a copper-fabricated shielding member 62 having a shape that a plurality of comb teeth alternately extend in the opposite directions to each other is provided above the coil 60 formed on the substrate 10. The shielding member 62 is grounded. When a shielding member having such a configuration is provided, the eddy current is allowed to be reduced.

FIG. 15C illustrates an annular shielding member. A shielding member 63 having a C-shape obtained by cutting out a part of a copper ring is provided on the outer periphery side of the coil 60 formed on the substrate 10. The shielding member 63 is grounded. When the shielding member 63 is provided, the eddy current is allowed to be reduced. In the example in FIG. 15C, the shielding member 63 is provided in the same plane as the coil 60 and hence thickness reduction of the magnetic permeability sensor is achieved. However, the obtained shielding effect is small in comparison with the configuration that the coil 60 is covered from the above as illustrated in FIGS. 15A and 15B.

Here, the above-described shielding member may be provided on both faces of the substrate 10 or, alternatively, only on the face opposite to the development unit. Further, it is preferable that the shielding member is grounded as described above. However, an effect is obtained even when the shielding member is not grounded.

Second Embodiment

The following description is performed for a dielectric permittivity sensor and a magnetic permeability and dielectric permittivity sensor according to the present invention which are obtained by improvement of the magnetic permeability sensor according to the present invention described above.

Figure 16:
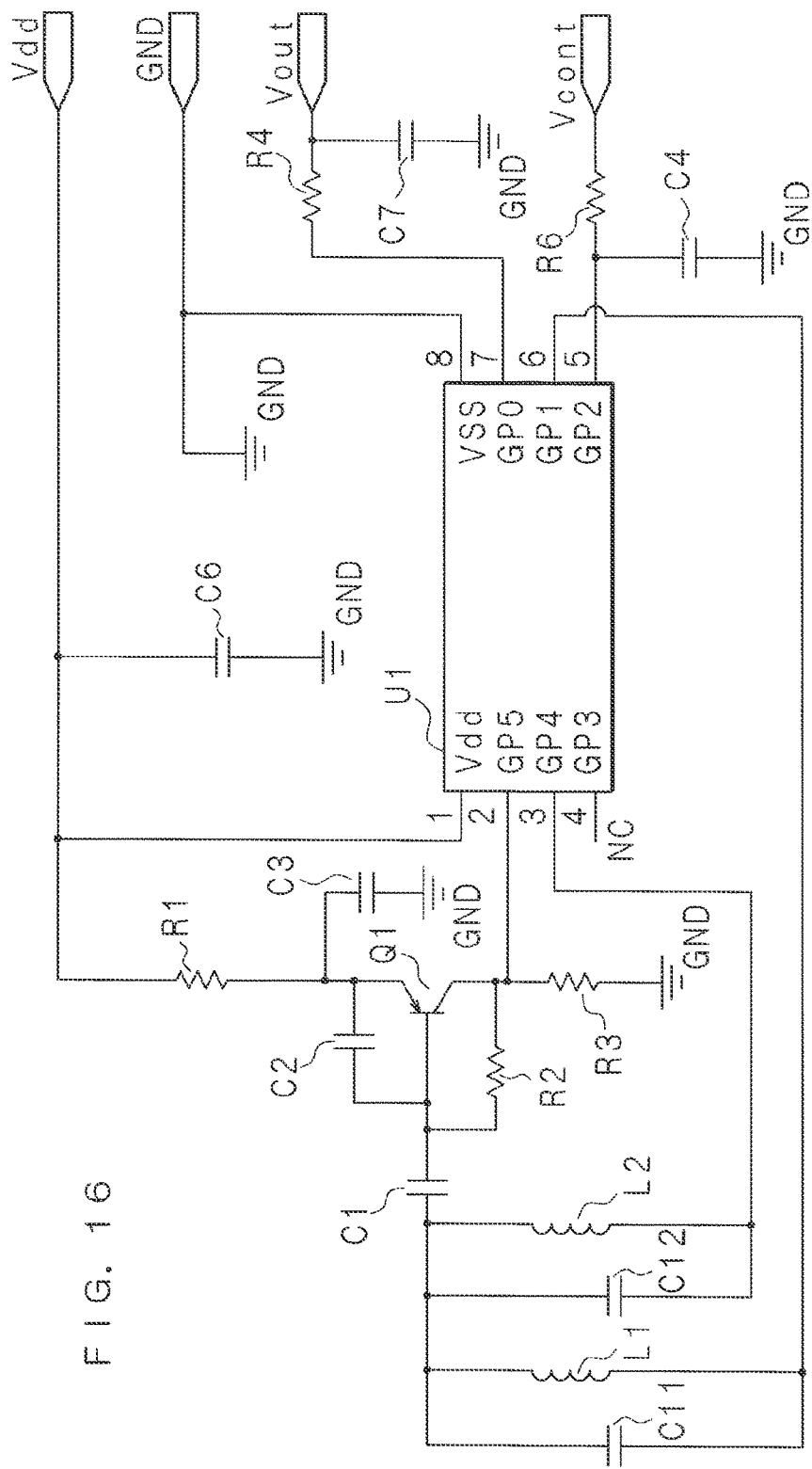
FIG. 16 is a circuit diagram illustrating an exemplary configuration of a dielectric permittivity sensor and a magnetic permeability and dielectric permittivity sensor according to the present invention.

FIG. 16 is a circuit diagram illustrating an exemplary configuration of a dielectric permittivity sensor and a magnetic permeability and dielectric permittivity sensor according to the present invention. In FIG. 16, like components to those in FIG. 5 are designated by like numerals. The circuit illustrated in FIG. 16 is obtained by adding a capacitor C11 and a capacitor C12 to the circuit illustrated in FIG. 5.

The capacitor C11 is provided in parallel to the coil L1. Then, one end of the capacitor C11 is connected to the sixth terminal of the microcomputer U1 and then the other end of the capacitor C11 is connected through the capacitor C1 to the base of the transistor Q1. The capacitor C12 is provided in parallel to the coil L2. Then, one end of the capacitor C12 is connected to the third terminal of the microcomputer U1 and then the other end of the capacitor C12 is connected through the capacitor C1 to the base of the transistor Q1.

Figure 17:
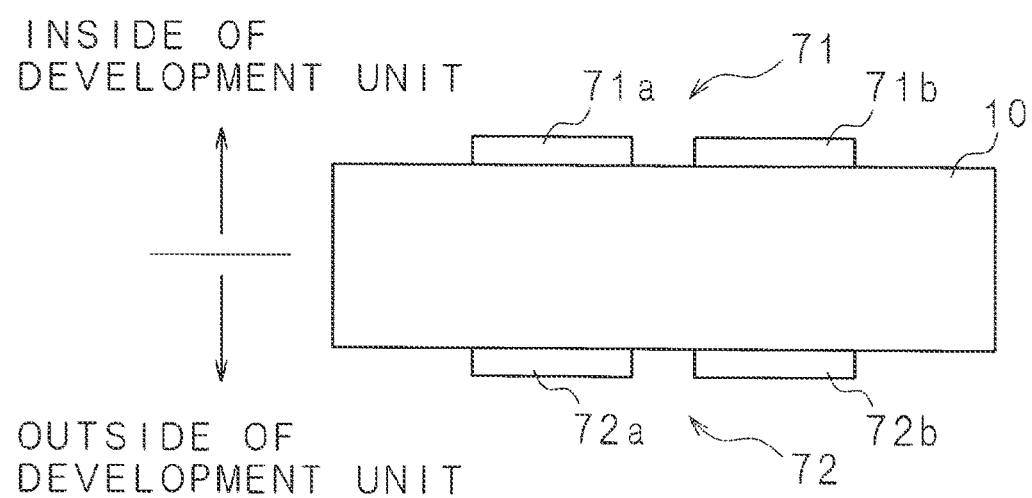
FIG. 17 is a sectional view illustrating a configuration of a part of a dielectric permittivity sensor and a magnetic permeability and dielectric permittivity sensor according to the present invention.

FIG. 17 is a sectional view illustrating the configuration of a part of the dielectric permittivity sensor and the magnetic permeability and dielectric permittivity sensor according to the present invention. In FIG. 17, numeral 10 indicates a substrate having a flat rectangular shape. This substrate 10 corresponds to the substrate 10 illustrated in FIGS. 1 to 3 described above.

On the upper face of the substrate 10 located in the inside of the development unit, a first capacitor 71 (for detection) including a pair of electrodes 71a and 71b is formed. Further, on the lower face of the substrate 10 located in the outside of the development unit, a second capacitor 72 (for reference) including a pair of electrodes 72a and 72b is formed. The first capacitor 71 and the second capacitor 72 respectively correspond to the capacitor C11 and the capacitor C12 in FIG. 16. Here, in FIG. 17, the first coil 1, the second coil 2, the connector 3, the electronic chip 4, the circuit components 5, and the like described above are not illustrated.

Figure 18:
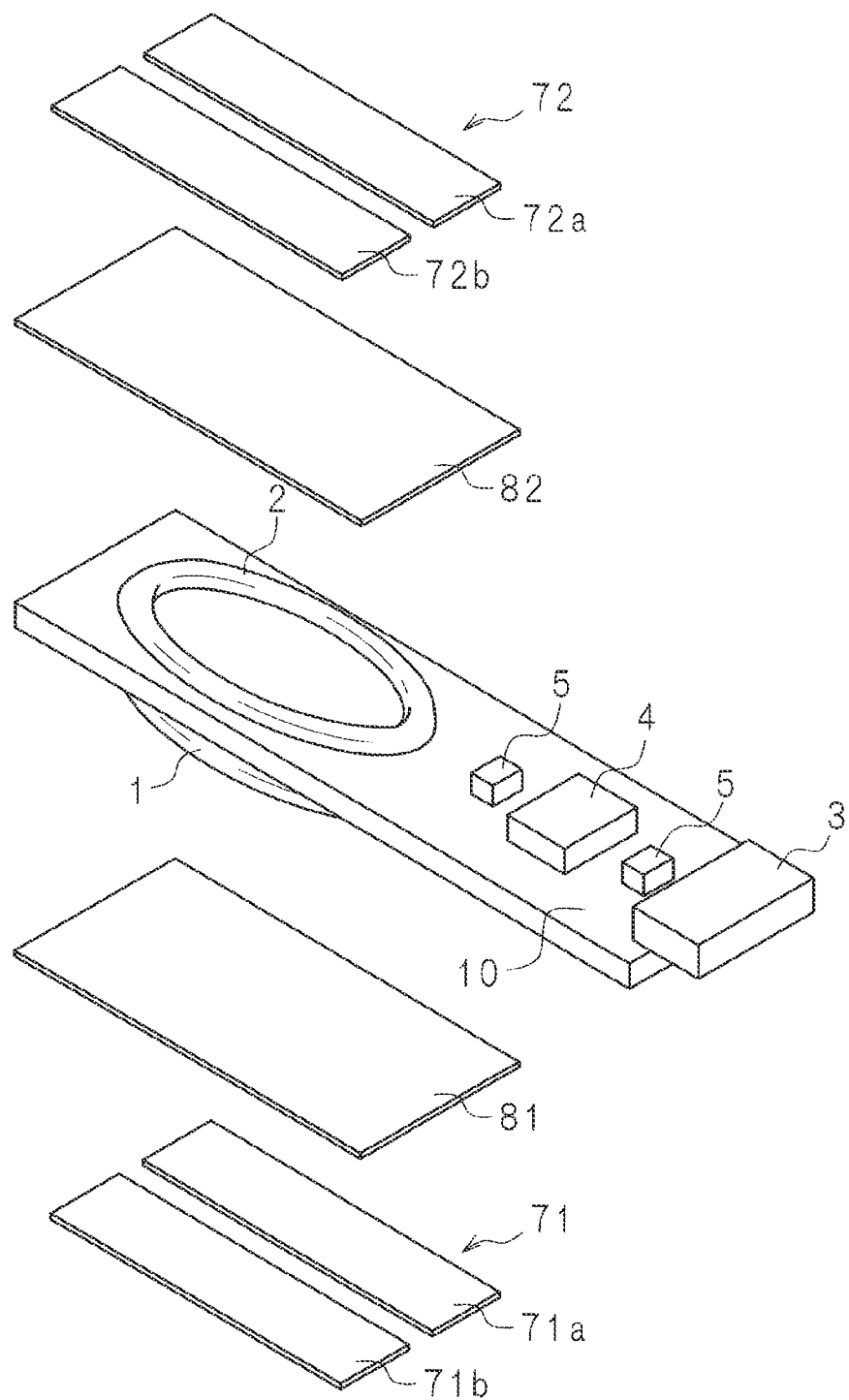
FIG. 18 is an exploded perspective view illustrating a configuration of a dielectric permittivity sensor and a magnetic permeability and dielectric permittivity sensor according to the present invention.
Figure 19:
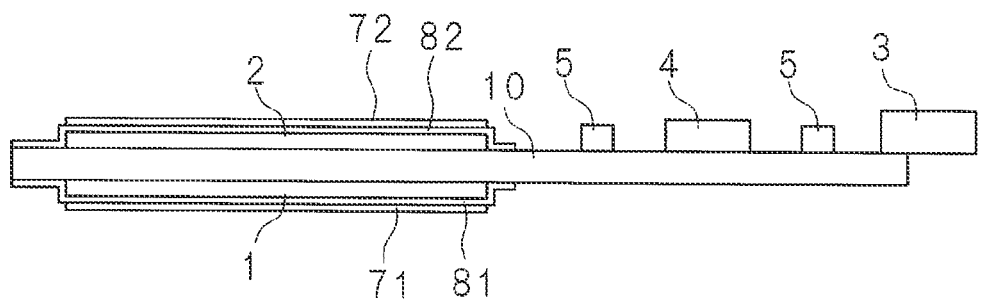
FIG. 19 is a sectional view illustrating a configuration of a dielectric permittivity sensor and a magnetic permeability and dielectric permittivity sensor according to the present invention.

FIGS. 18 and 19 are an exploded perspective view and a sectional view illustrating the configuration of the dielectric permittivity sensor and the magnetic permeability and dielectric permittivity sensor according to the present invention. These figures illustrate a situation that the first coil 1, the second coil 2, the connector 3, the electronic chip 4, and the circuit components 5 described above are added to the configuration in FIG. 17. The first capacitor 71 is provided at a position above the first coil 1 with an insulating layer 81 in between. The second capacitor 72 is provided at a position above the second coil 2 with an insulating layer 82 in between. The stack configuration of the coils and the capacitors permits size reduction of the sensor.

In the example illustrated in FIGS. 18 and 19, the first capacitor 71 and the second capacitor 72 are provided respectively above the corresponding one of the first coil 1 and the second coil 2. Instead, the first capacitor 71 and the second capacitor 72 may be provided respectively on the side parts of the first coil 1 and the second coil 2. In this case, the insulating layers 81 and 82 provided in between may be not provided.

Figure 20:
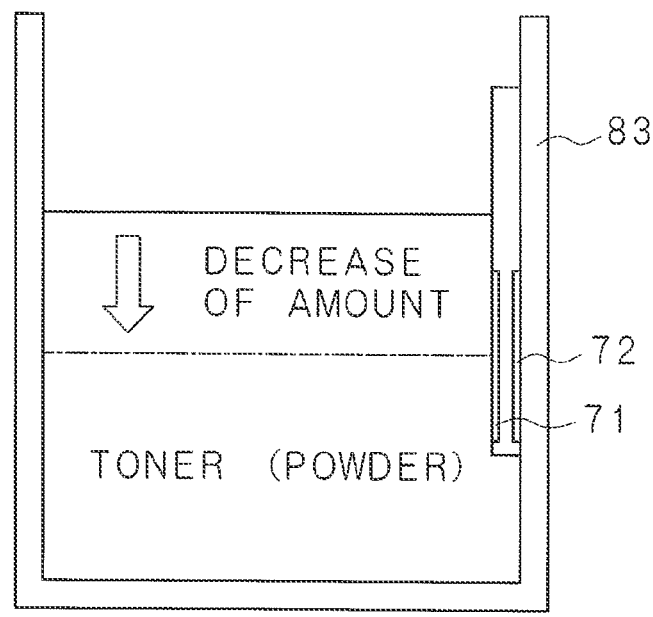
FIG. 20 is a side view illustrating an example of application of a dielectric permittivity sensor and a magnetic permeability and dielectric permittivity sensor according to the present invention.

In FIG. 17, the first capacitor 71 is arranged in the inside of the development unit and the second capacitor 72 is arranged in the outside of the development unit. Instead, both the first capacitor 71 and the second capacitor 72 may be arranged in the inside of the development unit. FIG. 20 illustrates an example of arrangement of the capacitors of this case, and is a side view illustrating an example of application of the dielectric permittivity sensor and the magnetic permeability and dielectric permittivity sensor according to the present invention.

In FIG. 20, numeral 83 indicates a resin-fabricated housing of the development unit illustrated schematically. The housing 83 contains toner (powder). When the capacitors are to be provided in the inside of the housing 83, the first capacitor 71 for detection that detects the toner is arranged on the side facing the toner (the powder) and the second capacitor 72 for reference is arranged on the inner wall surface of the housing 83 located on the side opposite to the toner (the powder). Here, in order that the second capacitor 72 may be prevented from going into direct contact with the toner, it is preferable that a cover fabricated from resin is provided.

Figure 21:
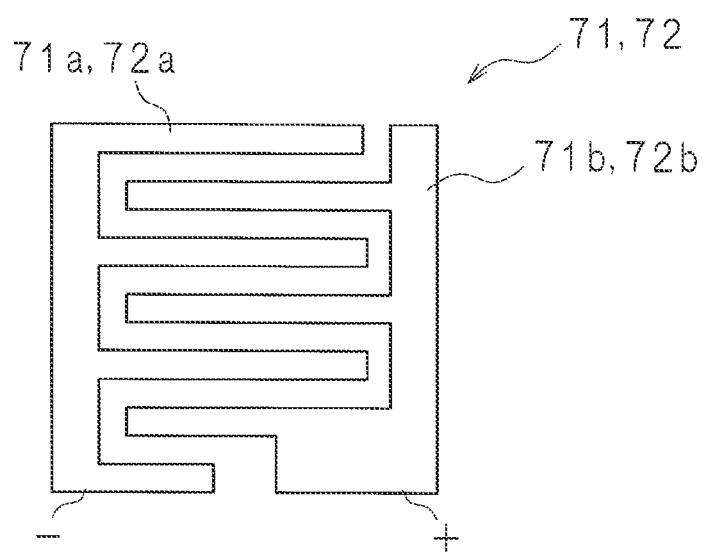
FIG. 21 is a plan view illustrating an electrode shape of a first capacitor or a second capacitor.

FIG. 21 is a plan view illustrating the electrode shape of the first capacitor 71 and the second capacitor 72. The first capacitor 71 is constructed by combining a pair of electrodes 71a and 71b each having a comb-tooth shape. Then, the second capacitor 72 is similarly constructed by combining a pair of electrodes 72a and 72b each having a comb-tooth shape.

Figure 22:
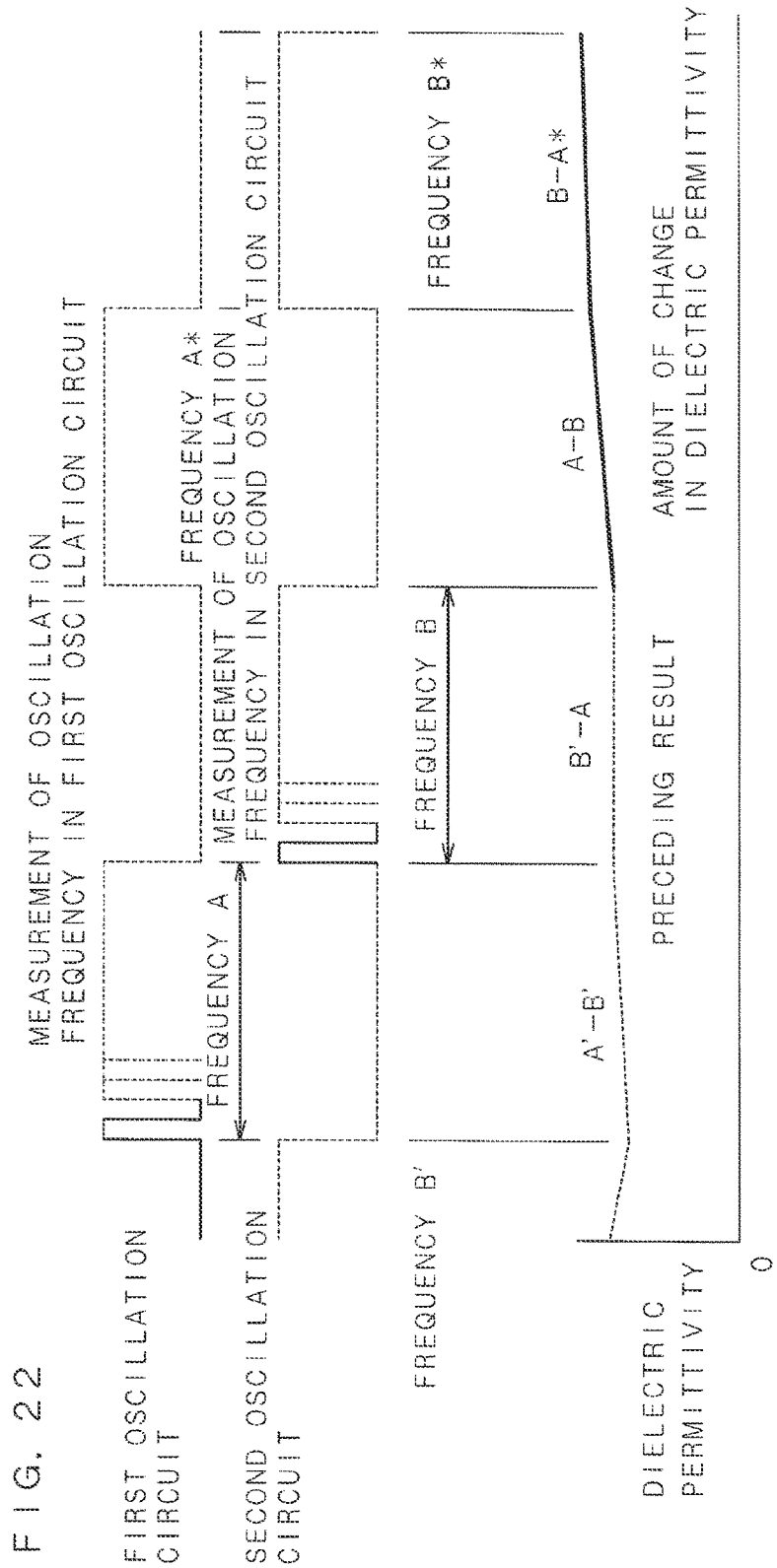
FIG. 22 is a timing chart describing operation of dielectric permittivity detection according to the present invention.

Next, the operation of dielectric permittivity detection is described below. In the present embodiment, the dielectric permittivity of the toner alone contained in the developing powder is detected. FIG. 22 is a timing chart describing the operation of dielectric permittivity detection according to the present invention. In the present embodiment, the coil L1 and the capacitor C11 (the first coil 1 and the first capacitor 71) in FIG. 16 constitute a first oscillation circuit and then the coil L2 and the capacitor C12 (the second coil 2 and the second capacitor 72) in FIG. 16 constitute a second oscillation circuit.

The first oscillation circuit and the second oscillation circuit are caused to oscillate alternately for a predetermined time each and then the oscillation frequency in each oscillation is measured. For example, the predetermined time is 2 ms. At that time, as illustrated in FIG. 22, during the time that the first oscillation circuit is caused to oscillate and the oscillation frequency is measured, the second oscillation circuit is not caused to oscillate. Further, during the time that the second oscillation circuit is caused to oscillate and the oscillation frequency is measured, the first oscillation circuit is not caused to oscillate. Thus, the oscillation frequency is measured without an influence from the oscillation of the other circuit and hence an accurate measured value is obtained.

When the measurement of the oscillation frequencies for the predetermined time (e.g., 2 ms) each has been completed, the difference is calculated between the measured oscillation frequency in the first oscillation circuit (resulting from the electrostatic capacitance of the capacitor C11) and the measured oscillation frequency in the second oscillation circuit (resulting from the electrostatic capacitance of the capacitor C12). Then, the calculated difference is converted into the dielectric permittivity so that the amount of change in the dielectric permittivity is obtained. In the case of a sensor attached to a development unit, the amount of toner is detected.

Further, during the time that the first oscillation circuit is caused to oscillate and the oscillation frequency is measured, the difference of the previously measured values (e.g., A' and B') of the first oscillation circuit and the second oscillation circuit is calculated and then the calculated difference is converted into the dielectric permittivity so that the amount of change in the dielectric permittivity is obtained. Thus, the amount of change in the dielectric permittivity is successively updated at the timing of start of measurement of the oscillation frequency of each oscillation circuit.

Here, various kinds of processing (the measurement processing, the calculation processing, and the conversion processing) described above may be performed by the measurement part 41, the calculation part 42, and the conversion part 43 illustrated in FIG. 4 described above.

The flowing description is performed for the principles that the dielectric permittivity is allowed to be detected (the amount of toner is allowed to be detected) by the procedure described above.

In the first capacitor 71 (the capacitor C11) arranged in the inside of the development unit, the dielectric permittivity (the electrostatic capacitance) varies in response to a change in the amount of toner. Then, the oscillation frequency of the first oscillation circuit varies in response to the change in the dielectric permittivity (the electrostatic capacitance). Specifically, when the dielectric permittivity (the electrostatic capacitance) increases, the oscillation frequency decreases. Here, the toner is fabricated from resin and is not a magnetic material. Thus, the inductance of the coil L1 does not vary. Between the oscillation frequency of the first oscillation circuit and the oscillation frequency of the second oscillation circuit for reference, a difference is generated in correspondence to the amount of change in the dielectric permittivity. As such, a correlation is present between the difference of the oscillation frequencies and the dielectric permittivity. Thus, according to the present invention, the dielectric permittivity of the subject material is allowed to be detected on the basis of the difference of the oscillation frequencies of the two oscillation circuits. Then, since the change in the dielectric permittivity of the subject material (the toner) is allowed to be detected as such, the amount of toner in the development unit is allowed to be detected on the basis of the detected change in the dielectric permittivity.

Meanwhile, the sensor having the circuit configuration illustrated in FIG. 16 is constructed merely by adding two capacitors to the circuit illustrated in FIG. 5 and hence contains the intact circuit configuration of the magnetic permeability sensor described above. Thus, the magnetic permeability of the subject material is also allowed to be detected by this sensor. That is, the one sensor is allowed to selectively perform detection of the magnetic permeability and detection of the dielectric permittivity.

In the embodiment described above, a pair of electrodes have been provided on each of the upper and the lower face of the substrate 10 so that two capacitors have been formed. Instead, one electrode may be provided on each of the upper and the lower face of the substrate 10 so that two capacitors may be formed with utilizing a virtual electrode in the surroundings. Such a capacitor configuration is described below as a modification.

(Modification)

Figure 23:
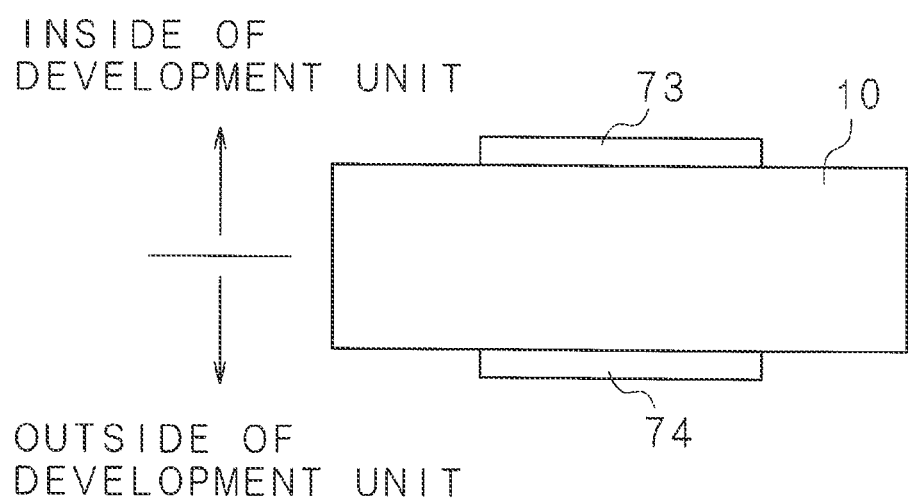
FIG. 23 is a sectional view illustrating a configuration of a part of a dielectric permittivity sensor and a magnetic permeability and dielectric permittivity sensor according to a modification.

FIG. 23 is a sectional view illustrating the configuration of a part of a dielectric permittivity sensor and a magnetic permeability and dielectric permittivity sensor according to a modification. In FIG. 23, numeral 10 indicates a substrate having a flat rectangular shape. This substrate 10 corresponds to the substrate 10 illustrated in FIGS. 1 to 3 described above. On the upper face of the substrate 10 located in the inside of the development unit, a positive electrode 73 (for detection) is formed that has a comb-tooth shape illustrated in FIG. 24 in plan view. Further, on the lower face of the substrate 10 located in the outside of the development unit, a positive electrode 74 (for reference) is formed that has similarly a comb-tooth shape illustrated in FIG. 24 in plan view. Here, in FIG. 23, the first coil 1, the second coil 2, the connector 3, the electronic chip 4, the circuit components 5, and the like described above are not illustrated.

Figure 25:
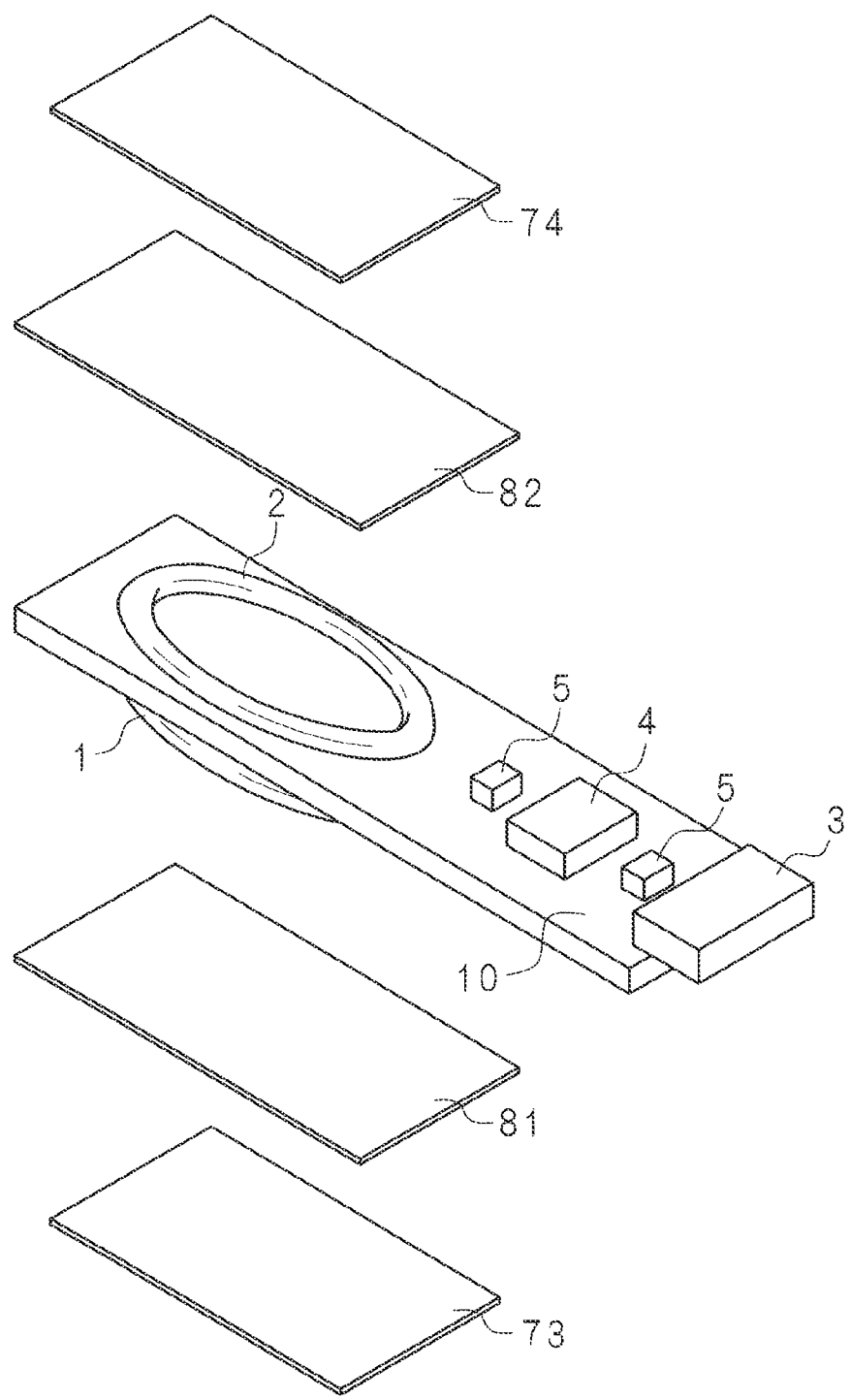
FIG. 25 is an exploded perspective view illustrating a configuration of a dielectric permittivity sensor and a magnetic permeability and dielectric permittivity sensor according to a modification.
Figure 26:
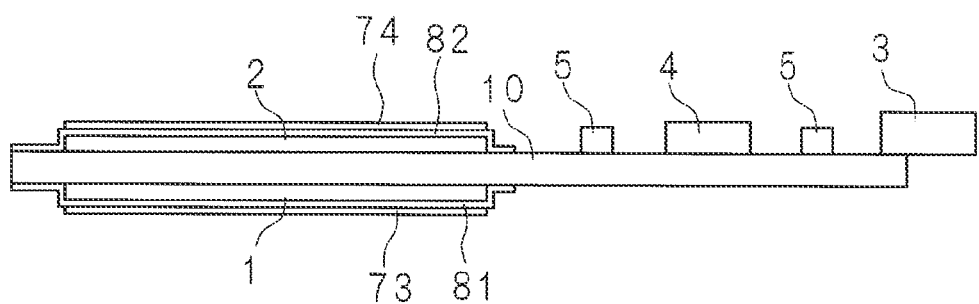
FIG. 26 is a sectional view illustrating a configuration of a dielectric permittivity sensor and a magnetic permeability and dielectric permittivity sensor according to a modification.

FIGS. 25 and 26 are an exploded perspective view and a sectional view illustrating the configuration of the dielectric permittivity sensor and the magnetic permeability and dielectric permittivity sensor according to the present modification. These figures illustrate a situation that the first coil 1, the second coil 2, the connector 3, the electronic chip 4, and the circuit components 5 described above are added to the configuration in FIG. 23. The positive electrode 73 is provided at a position above the first coil 1 with an insulating layer 81 in between. The positive electrode 74 is provided at a position above the second coil 2 with an insulating layer 82 in between. The stack configuration of the coils and the electrodes permits size reduction of the sensor. In the positive electrode 74 constituting the capacitor for reference, in order that the capacitance variation in the capacitor may be reduced, it is preferable that the surface is covered by dielectrics such as resin.

In the example illustrated in FIGS. 25 and 26, the positive electrode 73 and the positive electrode 74 are provided respectively above the corresponding one of the first coil 1 and the second coil 2. Instead, the positive electrode 73 and the positive electrode 74 may be provided respectively on the side parts of the first coil 1 and the second coil 2. In this case, the insulating layers 81 and 82 provided in between may be not provided.

The positive electrode 73 together with the negative electrode in the vicinity corresponds to the capacitor C11 in FIG. 16. Further, the positive electrode 74 together with the negative electrode in the vicinity corresponds to the capacitor C12 in FIG. 16. Here, as the negative electrode in the vicinity, the housing of the development unit or the metal housing of the printer may be utilized.

Figure 27:
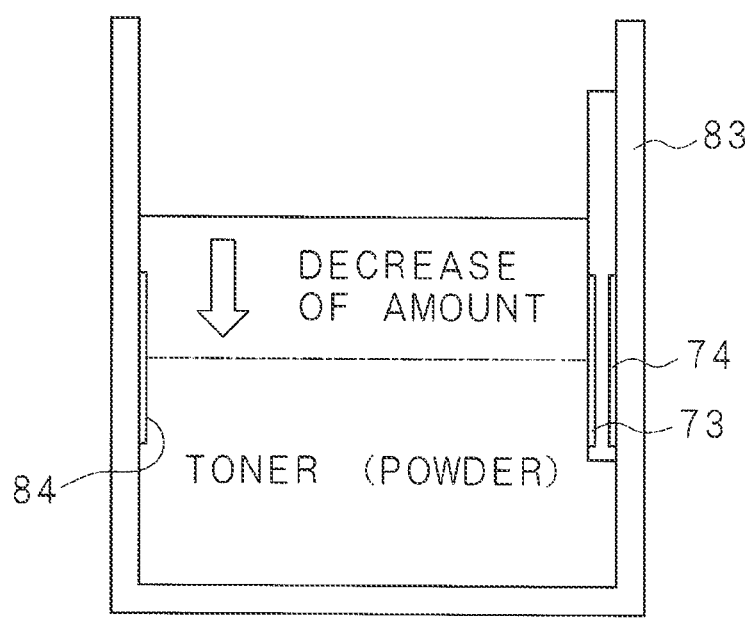
FIG. 27 is a side view illustrating an example of application of a dielectric permittivity sensor and a magnetic permeability and dielectric permittivity sensor according to a modification.

FIG. 27 is a side view illustrating an example of application of the dielectric permittivity sensor and the magnetic permeability and dielectric permittivity sensor according to the present modification. In FIG. 27, the sensor having the configuration illustrated in FIGS. 25 and 26 is arranged on the inner wall surface of the resin-fabricated housing 83 of the development unit illustrated schematically, in such a manner that the positive electrode 73 (for detection) is located on the side facing the toner (the powder) and the positive electrode 74 (for reference) is located on the side opposite to the toner (the powder). Then, a metal plate 84 is arranged on the inner wall surface of the housing 83 at an antipodal point relative to the sensor.

A positive potential is applied on the positive electrode 73 and the positive electrode 74. Thus, a negative potential is induced on the metal plate 84 opposite thereto. Here, the metal plate 84 may be grounded. However, even when the metal plate 84 is not grounded, the negative potential is induced. Meanwhile, in a case of absence of the metal plate 84, application of the positive potential onto the positive electrode 73 and the positive electrode 74 causes generation of the negative induced potential on the surface of the housing 83. Here, the housing 83 may be grounded and may be not grounded.

The metal plate 84 or the housing 83 surface on which the negative potential is induced is not directly connected by wiring to the sensor having the configuration illustrated in FIGS. 25 and 26. Thus, the metal plate 84 or the housing 83 surface may be recognized as a virtual electrode. Then, the positive electrode 73 for detection and the metal plate 84 or the housing 83 surface serving as a virtual electrode form a capacitor for detection. Further, the positive electrode 74 for reference and the housing 83 surface serving as a virtual electrode form a capacitor for reference.

Figure 28:
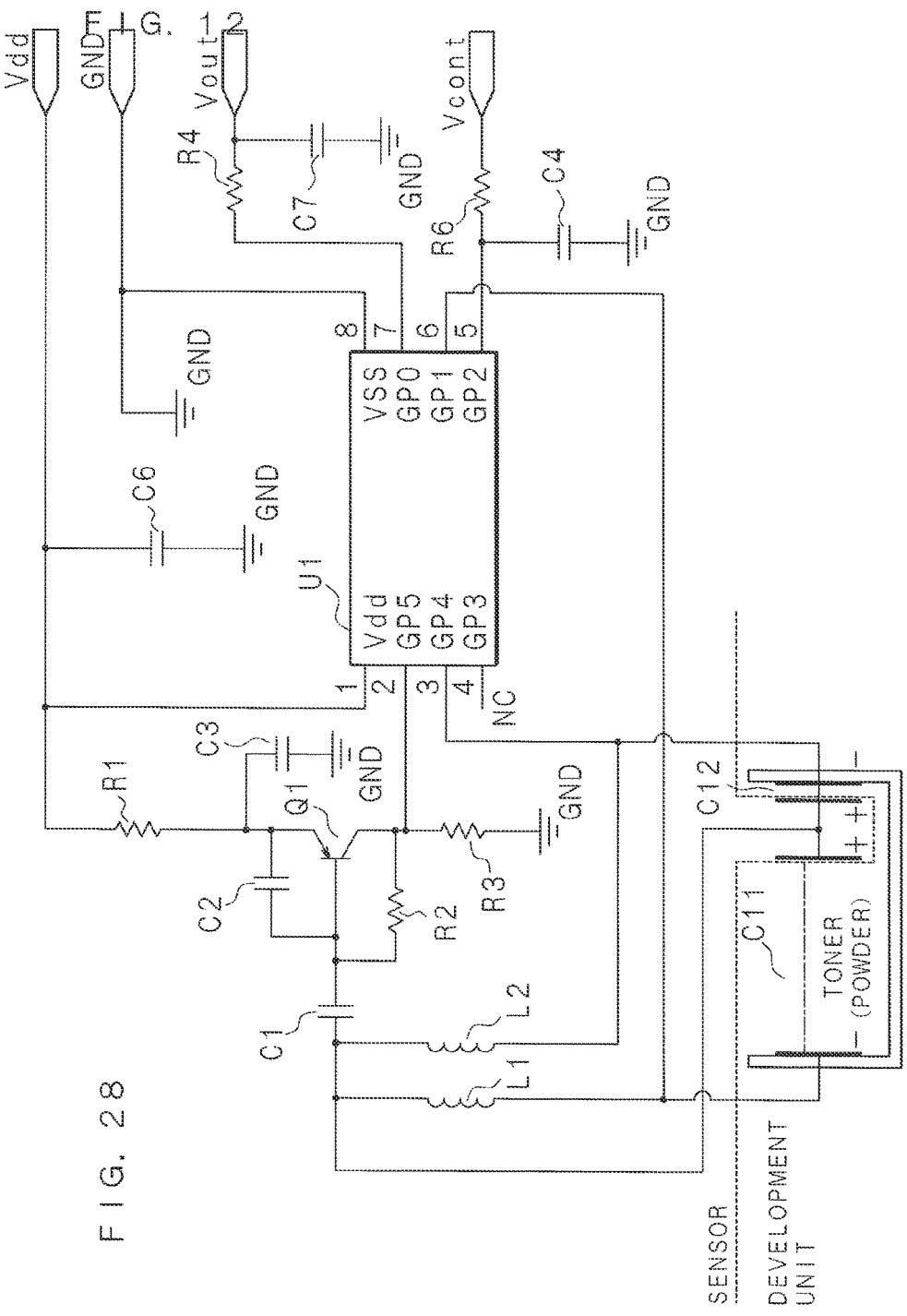
FIG. 28 is a diagram schematically illustrating a relation of connection between a sensor having a configuration illustrated in FIGS. 25 and 26 and a housing.

FIG. 28 is a diagram schematically illustrating the relation of connection between the sensor having the configuration illustrated in FIGS. 25 and 26 and the housing 83. FIG. 28 illustrates the relation of connection between each capacitor formed by utilizing the virtual electrode and the circuit other than the capacitors. In FIG. 28, like components to those in FIGS. 5 and 16 are designated by like numerals. When FIG. 28 is expressed in the form of a circuit diagram, the circuit is identical to that in FIG. 16. In this case, since the negative electrodes are absent in the capacitors, the expressed circuit diagram is regarded as an equivalent circuit.

Here, in order that the toner in the housing 83 may be prevented from going into direct contact with the positive electrode 74 for reference, the surface of the positive electrode 74 may be covered by dielectrics such as resin.

Even in the present modification having such a configuration, the amount of toner is allowed to be detected by utilizing a phenomenon that the dielectric permittivity between the positive electrode of the sensor and the virtual negative electrode varies in correspondence to the amount of toner. Here, the procedure of calculating the amount of change in the dielectric permittivity so as to detect the amount of toner is similar to the case of the exemplary configuration illustrated in FIGS. 18 and 19 described above. As such, in the present modification, a sensor including positive electrodes alone is employed and then a capacitor is formed between each positive electrode and a virtual electrode so that the dielectric permittivity (the amount of toner) is allowed to be detected.

Here, in the example described above, the capacitor for reference has been formed by the positive electrode 74 and the virtual electrode. Instead, the capacitor for reference may be formed by a pair of electrodes. In this case, a pair of electrodes 72a and 72b like those illustrated in FIG. 21 are arranged on the substrate 10.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A magnetic permeability sensor detecting a magnetic permeability of a subject material, comprising:
   a substrate having a first side and a second side opposite from the first side;
   a first oscillation circuit performing oscillation in a state of including a first coil receiving magnetism from the subject material, the first coil being formed on the first side of the substrate and wound about a first axis;
   a second oscillation circuit performing oscillation in a state of including a second coil receiving magnetism from the subject material, the second coil being formed on the second side of the substrate and wound about a second axis, the first coil and the second coil being arranged adjacently over the substrate and the first axis of the first coil and the second axis of the second coil being arranged in a coaxial manner to each other;
   a measurement part periodically and alternately measuring an oscillation frequency in the first oscillation circuit and the second oscillation circuit;
   a calculation part calculating a difference of the oscillation frequencies in the first oscillation circuit and the second oscillation circuit at each measurement by the measurement part; and
   a conversion part periodically converting the difference calculated by the calculation part into a magnetic permeability and determining a change in the magnetic permeability of the subject material,
   wherein the first oscillation circuit and the second oscillation circuit are configured to oscillate alternately such that during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

2. The magnetic permeability sensor according to claim 1, wherein the measurement part is constructed such as to alternately measure the oscillation frequency in the first oscillation circuit and the oscillation frequency in the second oscillation circuit.

3. The magnetic permeability sensor according to claim 1, wherein component members of the first oscillation circuit and the second oscillation circuit are shared with each other except for the first coil and the second coil.

4. A magnetic permeability detecting method of detecting a magnetic permeability of a subject material, comprising steps of:
   arranging a first coil wound about a first axis and a second coil wound about a second axis on an first side and a second side of a substrate, respectively, and adjacently over the substrate and arranging the first axis of the first coil and the second axis of the second coil in a coaxial manner to each other, such that distances thereof from the subject material are different from each other, the first side of the substrate being opposite from the second side;
   alternately oscillating a first oscillation circuit performing oscillation in a state of including the first coil and a second oscillation circuit performing oscillation in a state of including the second coil;
   periodically and alternately measuring an oscillation frequency of the first oscillation circuit and an oscillation frequency of the second oscillation circuit;
   calculating a difference of the measured oscillation frequencies in the first oscillation circuit and the second oscillation circuit at each measurement of the oscillation frequencies;
   periodically converting the calculated difference into a magnetic permeability; and
   determining a change in the magnetic permeability of the subject material from the periodic conversion of the calculated difference,
   wherein during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

5. A dielectric permittivity sensor detecting a dielectric permittivity of a subject material, comprising:
   a substrate having a first side and a second side opposite from the first side;
   a first oscillation circuit performing oscillation in a state of including a first capacitor arranged on the first side of the substrate in a region where the subject material is located;
   a second oscillation circuit performing oscillation in a state of including a second capacitor arranged on the second side of the substrate in a region where the subject material is not located and adjacently and in parallel with the first capacitor;
   a measurement part periodically and alternately measuring an oscillation frequency in the first oscillation circuit and the second oscillation circuit;
   a calculation part calculating a difference of the oscillation frequencies in the first oscillation circuit and the second oscillation circuit at each measurement by the measurement part; and
   a conversion part periodically converting the difference calculated by the calculation part into a dielectric permittivity and determining a change in the dielectric permeability of the subject material,
   wherein the first oscillation circuit and the second oscillation circuit are configured to oscillate alternately such that during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

6. The dielectric permittivity sensor according to 5, wherein the first capacitor includes a pair of electrodes provided in the region where the subject material is located and the second capacitor includes a pair of electrodes provided in the region where the subject material is not located.

7. The dielectric permittivity sensor according to 5, wherein the first capacitor includes one electrode provided in the region where the subject material is located.

8. A dielectric permittivity detecting method of detecting a dielectric permittivity of a subject material, comprising steps of:
arranging a first capacitor on a first side of a substrate in a region where the subject material is located and arranging a second capacitor on a second side of the substrate in a region where the subject material is not located and adjacently and in parallel with the first capacitor, the first side of the substrate being opposite from the second side;
alternately oscillating a first oscillation circuit performing oscillation in a state of including the first capacitor and a second oscillation circuit performing oscillation in a state of including the second capacitor;
periodically and alternately measuring an oscillation frequency of the first oscillation circuit and an oscillation frequency of the second oscillation circuit;
calculating a difference of the measured oscillation frequencies in the first oscillation circuit and the second oscillation circuit at each measurement;
periodically converting the calculated difference into a dielectric permittivity; and
determining a change in the dielectric permeability of the subject material,
wherein during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

9. A magnetic permeability and dielectric permittivity sensor selectively detecting a magnetic permeability or a dielectric permittivity of a subject material, comprising:
a substrate having a first side and a second side opposite from the first side;
a first oscillation circuit performing oscillation in a state of including a first coil and a first capacitor, at least the first coil being formed on the first side of the substrate and wound about a first axis;
a second oscillation circuit performing oscillation in a state of including a second coil and a second capacitor different from the first coil and the first capacitor of the first oscillation circuit, at least the second coil being formed on the second side of the substrate and wound about a second axis, the first coil and the second coil being arranged adjacently over the substrate and the first axis of the first coil and the second axis of the second coil being arranged in a coaxial manner to each other or the second capacitor being arranged adjacently and in parallel with the first capacitor over the substrate;
a measurement part periodically and alternately measuring an oscillation frequency in the first oscillation circuit and the second oscillation circuit;
a calculation part calculating a difference of the oscillation frequencies in the first oscillation circuit and the second oscillation circuit at each measurement by the measurement part; and
a conversion part periodically converting the difference calculated by the calculation part into a magnetic permeability or a dielectric permittivity and determining a change in the magnetic permeability or the dielectric permeability of the subject material,
wherein the first oscillation circuit and the second oscillation circuit are configured to oscillate alternately such that during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

10. A magnetic permeability and dielectric permittivity detecting method of selectively detecting a magnetic permeability or a dielectric permittivity of a subject material, comprising steps of:
arranging a first oscillation circuit performing oscillation in a state of including a first coil and a first capacitor, and a second oscillation circuit performing oscillation in a state of including a second coil and a second capacitor different from the first coil and the first capacitor of the first oscillation circuit, at least the first coil being formed on the first side of the substrate and wound about a first axis, at least the second coil being formed on the second side of the substrate and wound about a second axis, the first coil and the second coil being arranged adjacently over the substrate and the first axis of the first coil and the second axis of the second coil being arranged in a coaxial manner to each other over the substrate or the second capacitor being arranged adjacently and in parallel with the first capacitor;
alternately oscillating a first oscillation circuit performing oscillation in a state of including the first coil and a second oscillation circuit performing oscillation in a state of including the second coil;
periodically and alternately measuring each of an oscillation frequency of the first oscillation circuit and an oscillation frequency of the second oscillation circuit;
calculating a difference of the measured oscillation frequencies in the first oscillation circuit and the second oscillation circuit at each measurement;
periodically converting the calculated difference into a magnetic permeability or a dielectric permittivity; and
determining a change in the magnetic permeability or the dielectric permeability of the subject material,
wherein during the time that the first oscillation circuit is caused to oscillate and the oscillation frequency is measured, the second oscillation circuit is not caused to oscillate, and during the time that the second oscillation circuit is caused to oscillate and the oscillation frequency is measured, the first oscillation circuit is not caused to oscillate.

* * * * *